United States Patent
Fukamachi et al.

(10) Patent No.: US 8,610,105 B2
(45) Date of Patent: Dec. 17, 2013

(54) SEMICONDUCTOR ELECTROLUMINESCENT DEVICE WITH A MULTIPLE-QUANTUM WELL LAYER FORMED THEREIN

(75) Inventors: Toshihiko Fukamachi, Kokubunji (JP); Takashi Shiota, Saitama (JP); Takeshi Kitatani, Hino (JP); Nozomu Yasuhara, Yokohama (JP); Atsushi Nakamura, Komoro (JP); Mitsuhiro Sawada, Yokohama (JP)

(73) Assignee: Oclaro Japan, Inc., Yokohama-shi (JP)

( * ) Notice: Subject to any disclaimer, the term of this patent is extended or adjusted under 35 U.S.C. 154(b) by 975 days.

(21) Appl. No.: 12/614,859

(22) Filed: Nov. 9, 2009

(65) Prior Publication Data

US 2010/0288997 A1    Nov. 18, 2010

(30) Foreign Application Priority Data

May 15, 2009  (JP) .................................. 2009-119310
Oct. 30, 2009  (JP) .................................. 2009-250808

(51) Int. Cl.
  *H01L 33/00*  (2010.01)
(52) U.S. Cl.
  USPC  257/13; 257/14; 257/E29.005; 257/E33.008; 257/E33.069
(58) Field of Classification Search
  USPC ........ 257/13, 14, E33.008, E29.005, E33.069
  See application file for complete search history.

(56) References Cited

U.S. PATENT DOCUMENTS

| | | | |
|---|---|---|---|
| 5,363,392 A | 11/1994 | Kasukawa et al. | |
| 5,521,742 A * | 5/1996 | Ishimura | 359/248 |
| 5,671,242 A | 9/1997 | Takiguchi et al. | |
| 5,673,283 A | 9/1997 | Kajikawa et al. | |
| 5,739,543 A * | 4/1998 | Shimizu et al. | 257/14 |
| 5,903,587 A | 5/1999 | Miyashita | |
| 2002/0064199 A1 | 5/2002 | Takei et al. | |
| 2005/0127384 A1* | 6/2005 | Tsuchiya et al. | 257/98 |

FOREIGN PATENT DOCUMENTS

| | | |
|---|---|---|
| EP | 0 727 821 A2 | 8/1996 |
| JP | 03-003384 | 1/1991 |
| JP | 05-041564 | 2/1993 |
| JP | 05-145178 | 6/1993 |
| JP | 05-206575 | 8/1993 |
| JP | 07-193327 | 7/1995 |

(Continued)

OTHER PUBLICATIONS

Ohmsha, Ltd. "Strained-layer Quantum-Well Semiconductor Lasers and their Characteristics" Handotai Laser (Semiconductor Laser), Chapter 5, pp. 113-131; Oct. 1994 (Japanese language).

(Continued)

*Primary Examiner* — Lynne Gurley
*Assistant Examiner* — Vernon P Webb
(74) *Attorney, Agent, or Firm* — Foley & Lardner LLP

(57) ABSTRACT

Provided is a semiconductor electroluminescent device with an InGaAlAs-based well layer having tensile strain, or a semiconductor electroluminescent device with an InGaAsP-based well layer having tensile strain and with an InGaAlAs-based barrier layer which is high-performance and highly reliable in a wide temperature range. In a multiple-quantum well layer of the semiconductor electroluminescent device, a magnitude of interface strain at an interface between the well layer and the barrier layer is smaller than a magnitude of critical interface strain determined by a layer thickness value which is larger one of a thickness of the well layer and a thickness of the barrier layer.

19 Claims, 9 Drawing Sheets

(56) References Cited

FOREIGN PATENT DOCUMENTS

| | | |
|---|---|---|
| JP | 07-249828 | 9/1995 |
| JP | 08-078786 | 3/1996 |
| JP | 09-018089 | 1/1997 |
| JP | 09-246671 | 9/1997 |
| JP | 10-200205 | 7/1998 |
| JP | 10-223987 | 8/1998 |
| JP | 10-233555 | 9/1998 |
| JP | 11-112079 | 4/1999 |
| JP | 11-340558 A | 10/1999 |
| JP | 2000-216491 A | 8/2000 |
| JP | 2005-175295 | 6/2005 |
| WO | WO-95/15022 A1 | 6/1995 |

OTHER PUBLICATIONS

Shunji Seki, et al., "Theoretical Analysis of Pure Effects of Strain and Quantum Confinement on Differential Gain in InGaAsP/InP Strained-Layer Quantum-Well Lasers", IEEE Journal of Quantum Electronics, vol. 30, No. 2, pp. 500-510 (Feb. 1994) (The Institute of Electrical and Electronics Engineers, Inc.).

Peter J.A. Thijs, et al., "Progress in Long-Wavelength Strained-Layer InGaAs(P) Quantum-Well Semiconductor Lasers and Amplifiers" IEEE Journal of Quantum Electronics, vol. 30, No. 2, pp. 477499 (Feb. 1994) (The Institute of Electrical and Electronics Engineers, Inc.).

Peter J.A. Thijs, et al., "High-Performance $\lambda = 1.3$pm InGaAsP-InP Strained-Layer Quantum Well Lasers" Journal of Lightwave Technology, vol. 12, No. 1, p. 28-37 (Jan. 1994) (The Institute of Electrical and Electronics Engineers, Inc.).

J. W. Matthews, et al., "Defects in Epitaxial Multilayers" Journal of Crystal Growth 27, pp. 118-125 (1974) (North-Holland Publishing Co.).

K. Otsubo et al., "1.3 μm AIGaInAs MQW buried heterostructure Dfb lasers with semi-insulating blocking layers" 55th Spring Meeting (Japan Society of Applied Physics and Related Societies) pp. 1209 (with an English translation attached thereto).

Chung-En Zah et al., "High Performance Uncooled 1.3 μm $Al_xGayIn_{1-x-y}As$/InP Strained-Layer Quantum-Well Lasers for Subscriber Loop Applications", IEEE Journal of Quantum Electronics, vol. 30, No. 2, pp. 511-523 (The Institute of Electrical and Electronics Engineers, Inc.).

Z. Wang et al., "High speed, ultralow noise, tensile strained InGaAlAs MQW lasers emitting at 1300 nm for optical communication and microwave applications" Electronics Letters, vol. 30, No. 17, pp. 1413-1414 (Aug. 1994) (The Institute of Electrical and Electronics Engineers, Inc.).

Yasuhiro Matsui, et al., "30-GHz Bandwidth 1.55 μm Strain-Compensated InGaAlAs-InGaAsP MQW Laser" IEEE Photonics Technology Letters, vol. 9, No. 1, pp. 25-27 (Jan. 1997) (The Institute of Electrical and Electronics Engineers, Inc.).

Office Action received in Japanese Paten Application No. 2009-250808, dated Jul. 23, 2013 (with partial translation).

* cited by examiner

SEMICONDUCTOR ELECTROLUMINESCENT DEVICE WITH A MULTIPLE-QUANTUM WELL LAYER FORMED THEREIN

CROSS-REFERENCE TO RELATED APPLICATIONS

The present application claims priority from Japanese applications JP2009-119310 filed on May 15, 2009, and JP2009-250808, filed on Oct. 30, 2009, the contents of which are hereby incorporated by reference into this application.

BACKGROUND OF THE INVENTION

1. Field of the Invention

The present invention relates to a semiconductor electroluminescent device. More particularly, the present invention relates to improvement in characteristics of a semiconductor electroluminescent device in a wide temperature range.

2. Description of the Related Art

In recent years, in the information communication field, for example, a semiconductor electroluminescent device which realizes both reduction in threshold current and high-speed operation in a wide temperature range (for example, −20° C. or higher and 95° C. or lower) is being developed.

A typical semiconductor electroluminescent device has, for example, a structure in which a lower light confinement layer, an active layer, an upper light confinement layer, and an InP layer are formed in the stated order on an InP substrate. Ordinarily, in the active layer, semiconductor thin films having different band gaps are alternately laminated. More specifically, the structure is a so-called single-quantum well (hereinafter, referred to as SQW) structure, or a so-called multiple-quantum well (hereinafter, referred to as MQW) structure. It is to be noted that the term "MQW" as referred to herein includes not only an ordinary MQW but also the SQW.

In the MQW structure, a semiconductor thin film having a large band gap serves as a barrier layer and a semiconductor film having a small band gap serves as a well layer. The barrier layer confines carriers within the well layer. Bonding of the carriers, i.e., electrons and holes, causes light emission.

InGaAsP-based and InGaAlAs-based materials are representative semiconductor materials used for an MQW layer in a semiconductor electroluminescent device. A main difference between the two materials is a band offset when the MQW structure is formed by the materials. The band offset is defined as an energy difference of a band edge of a barrier layer from a band edge of a well layer both in a conduction band and in a valence band. The former is represented as $\Delta E_c$ and the latter is represented as $\Delta E_v$.

With regard to an InGaAsP-based material, $\Delta E_c = 0.4 \cdot \Delta E_g$ and $\Delta E_v = 0.6 \cdot \Delta E_g$, while with regard to an InGaAlAs-based material, $\Delta E_c = 0.7 \cdot \Delta E_g$ and $\Delta E_v = 0.3 \cdot \Delta E_g$. In order to obtain quantum effect, a thickness of a well layer in an MQW layer is ordinarily on the order of a Fermi wavelength with regard to both materials.

In a semiconductor electroluminescent device, in order to impose strain on a well layer, the composition of the well layer is ordinarily set such that the lattice constant thereof is different from the lattice constant of the substrate. This is because band degeneracy of light holes (hereinafter, referred to as LHs) and heavy holes (hereinafter, referred to as HHs) of the band structure at a band edge of a valence band of a well layer with no strain can be lifted by introducing strain in the well layer.

When the well layer has a lattice constant which is larger than that of the InP substrate, in other words, in the case of compressive strain, HHs contribute to oscillation, and considerable improvements in the characteristics of the electroluminescent device including the reduction in threshold current and the high-speed operation are realized. Similarly, when the well layer has a lattice constant which is smaller than that of the InP substrate, in other words, in the case of tensile strain, LHs contribute to oscillation ("Handotai Laser (Semiconductor Laser)" (Ohmsha, Ltd.), Chapter 5).

SUMMARY OF THE INVENTION

With regard to an InGaAsP-based material, theoretically, tensile strain has been expected to be preferable as the strain on the well layer of the MQW structure in the semiconductor electroluminescent device (Seki et al., IEEEJ. Quantum. Electro., Vol. 30, No. 2, pp. 500-509). This is because, as described above, in the case of a well layer having tensile strain, LHs contribute to oscillation, and, compared with the case of a well layer having compressive strain, the density of states and the optical transition matrix become larger, and, as a result, the gain and the differential gain become large and relaxation oscillation frequency $f_r$ is expected to be made larger.

However, actually, as described in Thijs et al., IEEEJ. Quantum. Electro., Vol. 30, No. 2, pp. 477-499, a semiconductor electroluminescent device according to Japanese Patent Application Laid-Open No. Hei 05-145178 could not experimentally attain satisfactory characteristics. This is thought to be because, with regard to an InGaAsP-based material, by imposing tensile strain on the well layer, $\Delta E_c$ becomes smaller, which, to the contrary, further makes the band degeneracy stronger (Thijs et al., IEEEJ. Quantum. Electro., Vol. 30, No. 2, pp. 477-499). With regard to an InGaAsP-based material, compared with the case of the well layer having compressive strain, satisfactory characteristics could not be attained even in a 1.3 μm band (Thijs et al., IEEEJ. Lightwave Tech., Vol. 12, No. 1, pp. 28-37). On the other hand, with regard to an InGaAlAs-based material, when tensile strain was imposed on the well layer, a gain region could not be designed in a 1.55 μm band.

Therefore, conventionally, a semiconductor electroluminescent device in which not tensile strain that was theoretically expected to be preferable but compressive strain was imposed on a well layer was developed. One reason is that, in particular, with regard to an InGaAlAs-based material, when tensile strain is imposed on a well layer, a high-quality crystal can not be obtained with stability, and thus, a semiconductor electroluminescent device having satisfactory characteristics can not be manufactured with stability.

This mistake results from a perception that tensile strain and compressive strain simply have exactly the opposite strains. As described above, in the case of the well layer having compressive strain, an HH band contributes to oscillation, while, in the case of the well layer having tensile strain, an LH band contributes to oscillation.

However, because the effective mass of a carrier differs between the HH band and the LH band, in order to lift the band degeneracy, in the case of the well layer having compressive strain, it is desirable that the well layer be made to be as thin as possible, while, in the case of the well layer having tensile strain, it is desirable that the well layer be made to be as thick as possible, and thus, the conditions for obtaining a crystal with stability greatly differ therebetween. Nevertheless, conventionally, a semiconductor electroluminescent device is hardly designed taking this viewpoint into consideration.

Generally, when, on a layer having a certain lattice constant, a layer having a different lattice constant, that is, a layer with strain (also referred to as lattice misfit) is laminated, a limit value (hereinafter, referred to as a critical layer thickness) is set on the layer thickness value of the laminated layer according to the amount of the strain. In other words, a limit value (hereinafter, referred to as a critical strain amount) is set on the strain amount according to the layer thickness value of the laminated layer. More specifically, as the strain amount of the laminated layer becomes larger, the critical layer thickness becomes smaller, while, as the layer thickness value of the laminated layer becomes larger, the critical strain amount becomes smaller. When a layer is laminated beyond those limit values, a defect occurs in a crystal in the layer.

A theory of the relationship between the layer thickness value and the critical strain amount is described in Matthews et al., J. Cryst. Growth 27 (1974), p. 118, and is expressed as the following Expression (1):

[Equation 1]

$$\varepsilon_c = \frac{b}{2\pi \cdot t} \cdot \frac{1 - v\cos^2\psi}{(1+v)\cos\phi}\left[\ln\left(\frac{t}{b}\right) + 1\right] \quad (1)$$

In Expression (1), $\varepsilon_c$ is the critical strain amount, t is the layer thickness value, b is a Burgers vector, $\Psi$ is an angle formed by a transition line and the Burgers vector, $\Phi$ is an angle formed by the direction of a slip and a film surface, and v is a Poisson's ratio. The relationship expressed by Expression (1) is hereinafter, referred to as Matthews' formula.

In an MQW layer of a semiconductor electroluminescent device, when a layer having strain is laminated with the layer thickness value being beyond the critical layer thickness or with the strain amount being beyond the critical strain amount, lattice relaxation or a lattice defect occurs in the crystal. As a result, the MQW layer can not be formed with stability, and stable characteristics of the semiconductor electroluminescent device can not be attained.

Therefore, even when the number of the well layers in the MQW structure is to be increased or the strain amount of the well layers is to be increased for the purpose of realizing higher-speed response, reduction in threshold current, and the like, a limit is set because of the critical layer thickness or the critical strain amount.

Regarding this point, conventionally, inventions are made such as Japanese Patent Application Laid-Open Nos. Hei 09-18089, Hei 10-200205, Hei 10-233555, and Hei 11-112079, which are extensions of the theory described in Matthews et al., J. Cryst. Growth 27 (1974), p. 118. For example, Japanese Patent Application Laid-Open Nos. Hei 09-18089, Hei 10-200205, and Hei 11-112079 describe conditions to be satisfied by the critical layer thickness with regard to a layer of a semiconductor thin film grown on a GaAs substrate. Further, for example, Japanese Patent Application Laid-Open No. Hei 10-233555 describes conditions to be satisfied by the critical layer thickness with regard to a layer of a semiconductor thin film grown on an InP substrate.

However, none of the above-mentioned patent documents describes conditions to be satisfied by an InGaAlAs-based MQW layer, and the description thereof is not sufficient to apply the conditions to an InGaAlAs-based MQW layer.

There are other inventions such as Japanese Patent Application Laid-Open Nos. Hei 03-3384, Hei 05-41564, Hei 07-193327, Hei 08-78786, and Hei 09-246671. However, Japanese Patent Application Laid-Open No. Hei 03-3384 limits the strain imposed on a well layer to compressive strain and thus, can not be applied to a well layer having tensile strain. Japanese Patent Application Laid-Open No. Hei 05-41564 relates to a different material, and, in addition, is insufficient because there is no limit to the number of the wells like that described in Matthews et al., J. Cryst. Growth 27 (1974), p. 118. Japanese Patent Application Laid-Open No. Hei 07-193327 relates to a GaAs substrate, and thus, is inapplicable. Japanese Patent Application Laid-Open No. Hei 08-78786 relates to a well layer having compressive strain with regard to an InGaAsP-based material, and thus, is inapplicable. Japanese Patent Application Laid-Open No. Hei 09-246671 uses a substrate which is different from an ordinary substrate, and thus, is inapplicable.

Further, as described in Japanese Patent Application Laid-Open No. Hei 10-223987, there are cases in which the thicknesses of the well layers and the strain amounts of the well layers are not necessarily required to be the same over the layers in order to attain the target characteristics. Therefore, also from such a viewpoint, there is a limit to application of the above-mentioned Matthews et al., J. Cryst. Growth 27 (1974), p. 118, Japanese Patent Application Laid-Open Nos. Hei 09-18089, Hei 10-200205, Hei 10-233555, Hei 11-112079, Hei 03-3384, Hei 05-41564, Hei 07-193327, Hei 08-78786, and Hei 09-246671 to an InGaAlAs-based MQW layer as they are, and such application is insufficient. In particular, with regard to a well layer having tensile strain, a systematic manufacturing method is not conventionally found due to the reasons described above and the like.

A proof lies in the fact that, while there are many reports which are non-patent documents with regard to an InGaAlAs-based semiconductor electroluminescent device with a well layer having compressive strain including $N_w$=15 in Lecture Proceeding 29p-ZQ-5 of the 55th Spring Meeting, 2008, (Japan Society of Applied Physics and Related Societies), reports with regard to a well layer having tensile strain including Zah et al., IEEE J. Quantum. Electro., Vol. 30, No. 2, pp. 511-523 and Wang et al., Electron. Lett., Vol. 30, No. 17, pp. 1413-1414 are limited in number. Conventionally, a method of manufacturing an MQW layer including a quantum well layer having tensile strain which uses an InGaAlAs-based material is not found, which indicates how difficult it is to manufacture a crystal in such an MQW layer.

As described above, it is conventionally difficult to realize a semiconductor electroluminescent device with an InGaAlAs-based well layer having tensile strain which is theoretically expected to attain satisfactory characteristics in a wide temperature range.

Similarly, conventionally, in the case of the 1.3 μm band, it is also difficult to form an MQW layer including an InGaAsP-based well layer and an InGaAlAs-based barrier layer. In the case of the 1.55 μm band, Matsui et al., IEEE Photonics Technology Letters, Vol. 9, No. 1, pp. 25-27, for example, reports a pioneering research, but a semiconductor electroluminescent device in the 1.3 μm band is not realized. This is because the growth temperature of a crystal in the InGaAsP-based well layer is different from that of a crystal in the InGaAlAs-based barrier layer. In addition, this is also due to the amount of P contained in the well layer and the amount of Al contained in the barrier layer.

In order to obtain gain necessary for light emission in the 1.3 μm band, generally, both the amount of P contained in the well layer and the amount of Al contained in the barrier layer are required to be increased compared with the case of the 1.55 μm band. On the other hand, the growth temperature of the InGaAsP-based material is on the order of 600° C. while the growth temperature of the InGaAlAs-based material is on the order of 700° C., that is the difference therebetween is on the order of 100° C.

Therefore, in epitaxial growth, when the InGaAsP-based well layer is grown at 600° C., and then, the temperature is raised to 700° C. in order to grow the InGaAlAs-based barrier layer, P contained in the well layer vaporizes and the composition changes. On the other hand, when the growth temperature is 600° C., a crystal cannot be satisfactorily formed in the InGaAlAs-based material.

As described in Japanese Patent Application Laid-Open No. Hei 07-249828, in the 1.55 μm band, by making the growth temperature at 650° C. which is an intermediate temperature, the above-mentioned problem can be avoided. However, in the 1.3 μm band, because the amount of P contained in the well layer or the amount of Al contained in the barrier layer is higher compared with that in the 1.55 μm band, a similar method can not prevent the composition from being changed, and thus, conventionally, a wafer with satisfactory characteristics can not be obtained in the 1.3 μm band.

As described above, in the semiconductor electroluminescent device in the 1.3 μm band with the InGaAlAs-based well layer having tensile strain, and, in the semiconductor electroluminescent device in the 1.3 μm band with the InGaAsP-based well layer having tensile strain and with the InGaAlAs-based barrier layer, it is difficult to manufacture a high-performance and highly reliable semiconductor electroluminescent device in a wide temperature range. It is to be noted that, in manufacturing the conventional semiconductor electroluminescent device, a limit value of interface strain which occurs at respective interfaces between the well layer and the barrier layer in the MQW layer (hereinafter, referred to as critical interface strain) is not considered.

The present invention has been made in view of the problem described above, and an object of the present invention is to provide a high-performance and highly reliable semiconductor electroluminescent device.

(1) A semiconductor electroluminescent device according to the present invention includes: a substrate; and a multiple-quantum well layer formed above the substrate, the multiple-quantum well layer including $In_{1-x-y}Ga_xAl_yAs$-based well layers and $In_{1-x-y}Ga_xAl_yAs$-based barrier layers which are alternately disposed, the well layers each having tensile strain, the barrier layers each having compressive strain, a magnitude of interface strain at an interface between each of the well layers and each of the barrier layers being smaller than a magnitude of critical interface strain determined by a layer thickness value which is larger one of a thickness of the well layer and a thickness of the barrier layer adjacent to each other with the interface therebetween.

(2) In the semiconductor electroluminescent device according to Item (1), the magnitude of the critical interface strain may be determined based on a largest strain amount, the largest strain amount being determined by Matthews' formula.

(3) In the semiconductor electroluminescent device according to Item (2), the magnitude of the critical interface strain may be 0.7 times the largest strain amount, the largest strain amount being determined by Matthews' formula.

(4) In the semiconductor electroluminescent device according to Item (3), the magnitude of the interface strain may be 0.7% or larger and 2.2% or smaller.

(5) In the semiconductor electroluminescent device according to any one of Items (1) to (4), a magnitude of average strain of the multiple-quantum well layer may be smaller than a magnitude of critical average strain, the magnitude of the critical average strain being determined by a layer thickness value of the entire multiple-quantum well layer.

(6) In the semiconductor electroluminescent device according to Item (5), the magnitude of the critical average strain may be determined based on a largest strain amount, the largest strain amount being determined by Matthews' formula.

(7) In the semiconductor electroluminescent device according to any one of Items (1) to (6), each of the well layers may have a composition amount 1−x−y of In which is 0.21 or larger and 0.44 or smaller.

(8) In the semiconductor electroluminescent device according to Item (7), each of the barrier layers may have a composition amount x of Ga which is 0 or larger and a composition amount y of Al which is 0.43-0.36x or larger and 0.476-1.017x or smaller.

(9) In the semiconductor electroluminescent device according to Item (8), a number of the well layers may be 5 or larger.

(10) Another semiconductor electroluminescent device according to the present invention includes: a substrate; and a multiple-quantum well layer formed above the substrate, the multiple-quantum well layer including $In_{1-x}Ga_xAs_yP_{1-y}$-based well layers and $In_{1-x-y}Ga_xAl_yAs$-based barrier layers which are alternately disposed, the well layers each having tensile strain, the barrier layers each having compressive strain, the semiconductor electroluminescent device outputting light having a wavelength in a 1.3 μm band.

(11) Still another semiconductor electroluminescent device according to the present invention includes: a substrate; and a multiple-quantum well layer formed above the substrate, the multiple-quantum well layer including $In_{1-x}Ga_xAs_yP_{1-y}$-based well layers and $In_{1-x-y}Ga_xAl_yAs$-based barrier layers which are alternately disposed, the well layers each having tensile strain, the barrier layers each having compressive strain, a magnitude of interface strain at an interface between each of the well layers and each of the barrier layers being smaller than a magnitude of critical interface strain determined by a layer thickness value which is larger one of a thickness of the well layer and a thickness of the barrier layer adjacent to each other with the interface therebetween.

(12) In the semiconductor electroluminescent device according to Item (11), the magnitude of the critical interface strain may be determined based on a largest strain amount, the largest strain amount being determined by Matthews' formula.

(13) In the semiconductor electroluminescent device according to Item (12), the magnitude of the critical interface strain may be 0.7 times the largest strain amount, the largest strain amount being determined by Matthews' formula.

(14) In the semiconductor electroluminescent device according to Item (13), the magnitude of the interface strain may be 0.7% or larger and 2% or smaller.

(15) In the semiconductor electroluminescent device according to any one of Items (11) to (14), a magnitude of average strain of the multiple-quantum well layer may be smaller than a magnitude of critical average strain, the magnitude of the critical average strain being determined by a layer thickness value of the entire multiple-quantum well layer.

(16) In the semiconductor electroluminescent device according to Item (15), the magnitude of the critical average strain may be determined based on a largest strain amount, the largest strain amount being determined by Matthews' formula.

(17) In the semiconductor electroluminescent device according to any one of Items (11) to (16), each of the well layers may have a composition amount 1−x of In which is 0.4 or larger and 0.6 or smaller and a composition amount 1−y of P which is 0.09 or larger and 0.35 or smaller.

(18) In the semiconductor electroluminescent device according to Item (17), each of the barrier layers may have a composition amount x of Ga which may be 0 or larger and a composition amount y of As which is 0.384−0.33x or larger and 0.476−1.017x or smaller.

(19) In the semiconductor electroluminescent device according to Item (18), a number of the well layers may be 5 or larger.

(20) The semiconductor electroluminescent device according to any one of Items (1) to (19) may further have a ridge stripe structure.

(21) The semiconductor electroluminescent device according to Items (20) may have a ridge stripe width of 3 μm or smaller.

(22) The semiconductor electroluminescent device according to Items (20) may further include a Fabry-Perot laser unit.

(23) The semiconductor electroluminescent device according to Items (20) may further include a distributed feedback grating.

In manufacturing the conventional semiconductor electroluminescent device, critical interface strain which occurs at each interface between the well layer and the barrier layer in the MQW layer is not considered. On the other hand, according to the present invention, critical interface strain is considered, and hence the semiconductor electroluminescent device with the InGaAlAs-based well layer having tensile strain, or the semiconductor electroluminescent device with the InGaAsP-based well layer having tensile strain and with the InGaAlAs-based barrier layer which is high-performance and highly reliable in a wide temperature range can be provided.

DETAILED DESCRIPTION OF THE INVENTION

Embodiments according to the present invention are described in detail in the following. It is to be noted that the drawings referred to in the following are for the purpose of merely describing examples of the embodiments, and are not drawn to scale.

First Embodiment

A semiconductor electroluminescent device according to a first embodiment of the present invention is a semiconductor electroluminescent device in the 1.3 μm band in which an MQW layer including $In_{1-x-y}Ga_xAl_y$As-based well layers and $In_{1-x-y}Ga_xAl_y$As-based barrier layers is formed above an InP substrate. Each of the well layers in the MQW layer has tensile strain while each of the barrier layers has compressive strain. A semiconductor electroluminescent device as used herein is, for example, a ridge stripe Fabry-Perot laser device.

When the lattice constant of the InP substrate is represented by $a_0$, the lattice constant of the well layers is represented by a, and the lattice constant of the barrier layers is represented by b, the strain amounts of the well layers and the barrier layers are defined as $\epsilon_w=(a-a_0)/a_0$ and $\epsilon_b=(b-a_0)/a_0$, respectively. In this case, the term "tensile strain" indicates that the strain amount is negative, that is, the lattice constant is smaller than the lattice constant of the substrate. The term "compressive strain" indicates that the strain amount is positive, that is, the lattice constant is larger than the lattice constant of the substrate.

Figure 3A:
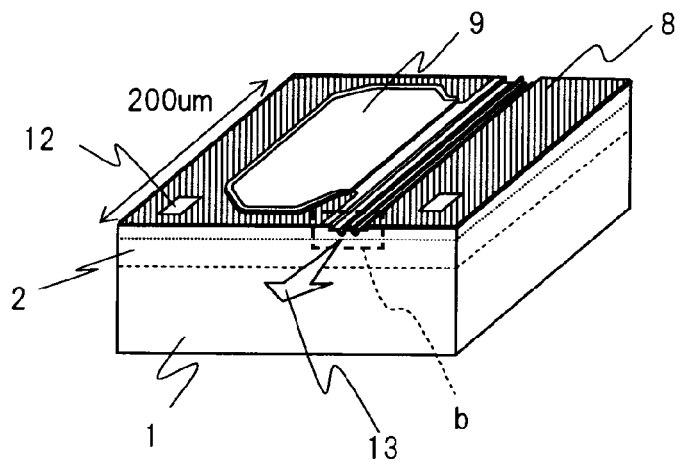
FIGS. 3A to 3C are views illustrating a structure of a ridge stripe Fabry-Perot laser device according to the embodiment of the present invention.
Figure 3B:
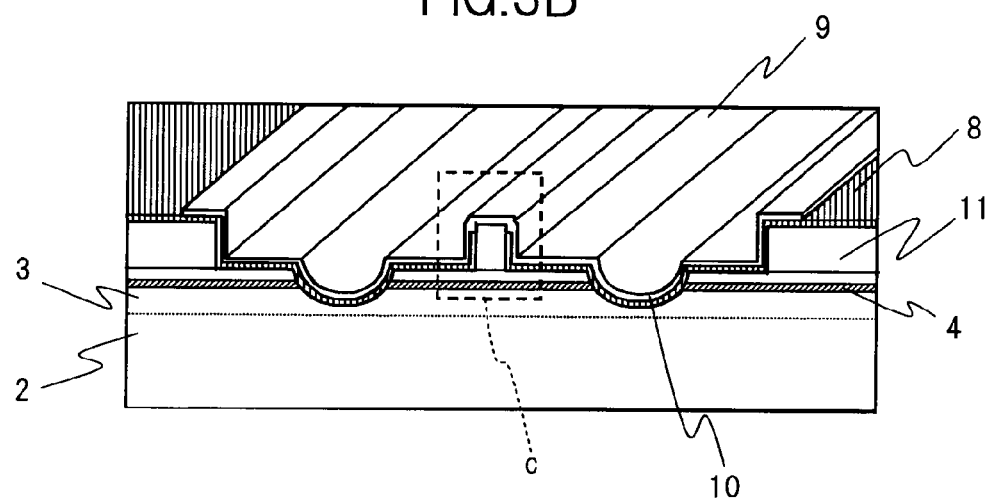
Figure 3C:
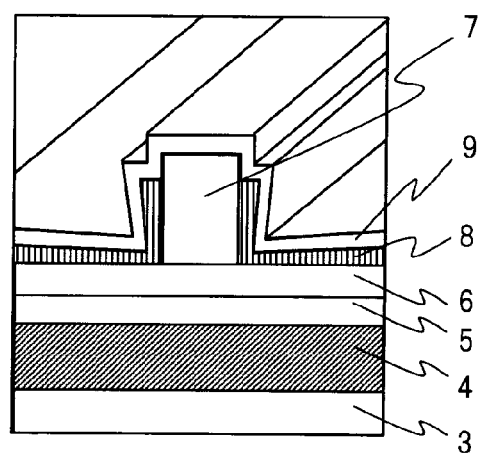

FIGS. 3A to 3C are views illustrating a structure of a ridge stripe Fabry-Perot laser device. FIG. 3A is a perspective view of the entire laser device, FIG. 3B is an enlarged sectional view of a portion surrounded by the broken line b of FIG. 3A, and FIG. 3C is an enlarged sectional view of a portion surrounded by the broken line c of FIG. 3B.

First, a method of manufacturing the laser device is described in brief. An n-type InP buffer layer 2 at a thickness of 500 nm, an n-side SCH layer 3 made of InAlAs at a thickness of 50 nm, an MQW layer 4 having the structures described in the following, a p-side SCH layer 5 made of InAlAs at a thickness of 50 nm, and an InGaAsP layer 6 at a thickness of 50 nm are formed in the stated order by epitaxial growth on an n-type InP substrate 1. Here, the MQW layer 4 is formed by alternately laminating well layers and barrier layers. A barrier layer is located on an outer side of each of well layers at one end and at the other end. The well layers and the barrier layers in the MQW layer 4 have tensile strain and compressive strain, respectively, but all of the layers other than the MQW layer 4 are formed so as to have no strain. The InGaAsP layer 6 is formed with a composition having a composition wavelength λ of 1,200 nm.

Then, a p-type InP layer 7 at a thickness of 2 μm is formed on the InGaAsP layer 6. Further, etching is carried out such that the width of the p-type InP layer 7 is 1.5 μm. This makes a ridge stripe structure of the p-type InP layer 7. Further, in order to reduce the parasitic capacitance, an isolation groove 10 is formed adjacently to each side of the p-type InP layer 7. Further, in order to prevent extra force from concentrating on and breaking the p-type InP layer 7 in cleavage, mounting, or the like, shoulder portions 11 for reinforcement are formed as illustrated in FIG. 3B.

A passivation film 8 is formed on an upper surface of the device except for a portion over the p-type InP layer 7. Further, a p-type electrode 9 is formed as illustrated in FIG. 3A so as to be in satisfactory contact with a top portion of the p-type InP layer 7 and such that current is easily injected. Further, in order to easily discriminate the front from the rear, front marks 12 are formed on a front side of the upper surface of the device (FIG. 3A). Coating films (not shown) are formed on a front end surface and a rear end surface such that the reflectivities thereof are 40% and 90%, respectively. It is to be noted that the length of a resonator of the device is 200 μm.

TABLE 1

| Sample no. | $N_w$ | $L_w$ (nm) | $L_b$ (nm) | $\epsilon_w$ (%) | $\epsilon_b$ (%) |
|---|---|---|---|---|---|
| 1-1 | 3 | 13 | 8 | −1.2 | +0.6 |
| 1-2 | 3 | 13 | 8 | −1.3 | +0.6 |
| 1-3 | 3 | 13 | 8 | −1.4 | +0.6 |
| 1-4 | 3 | 13 | 8 | −1.5 | +0.6 |
| 1-5 | 3 | 13 | 8 | −1.55 | +0.6 |
| 1-6 | 3 | 13 | 8 | −1.6 | +0.6 |
| 1-7 | 3 | 13 | 8 | −1.65 | +0.6 |
| 1-8 | 5 | 13 | 8 | −1.5 | +0.6 |
| 1-9 | 3 | 13 | 8 | −1.5 | +0.8 |
| 1-10 | 2 | 16 | 8 | −1.5 | +0.6 |
| 1-11 | 2 | 15 | 8 | −1.5 | +0.6 |
| 1-12 | 2 | 14 | 8 | −1.5 | +0.6 |
| 1-13 | 2 | 13 | 8 | −1.6 | +0.6 |
| 1-14 | 3 | 11 | 8 | −1.7 | +0.6 |
| 1-15 | 3 | 11 | 8 | −1.5 | +0.6 |

Table 1 shows the structures of the MQW layer 4 with regard to a plurality of laser devices of examples according to this embodiment and comparative examples. By using the above-mentioned manufacturing method, a plurality of wafers are manufactured so as to have the structures shown in Table 1, and the plurality of laser devices are manufactured using those wafers. The characteristics of the plurality of laser devices are to be described in the following.

In Table 1, $N_w$ denotes the number of the well layers, $L_w$ denotes the thickness of the well layers, $L_b$ denotes the thickness of the barrier layers, $\epsilon_w$ denotes the strain amount of the well layers, and $\epsilon_b$ denotes the strain amount of the barrier layers. The well layers and the barrier layers forming the MQW layer 4 have the thicknesses and the strain amounts shown in Table 1, respectively, and the layers other than the MQW layer 4 are formed so as to have the same structure. It is to be noted that, with regard to all the samples, the barrier layers of the MQW layer 4 are formed of $In_{1-x-y}Ga_xAl_yAs$ such that a composition wavelength $\lambda_b$ is 900 nm when no strain is imposed thereon.

With regard to the plurality of wafers manufactured so as to have the structures shown in Table 1, the luminescence wavelength was determined by photoluminescence. With regard to all the wafers, one oscillation peak was observed at about 1.3 μm. Further, visual inspection of upper surfaces of the wafers was made. A slight crosshatch which indicated lattice relaxation was observed on the upper surfaces of Samples 1-5, 1-6, 1-7, 1-8, 1-9, 1-10, 1-11, and 1-14. The upper surfaces of other wafers were in a mirror-smooth state.

With regard to the laser devices manufactured using those wafers, output light 13 illustrated in FIG. 3A was detected, and current-light output characteristics were measured. At 25° C., oscillation was recognized with regard to all the manufactured samples. Further, with regard to all the laser devices, TM mode oscillation was recognized.

It is to be noted that, in this embodiment, the ridge stripe width is adapted to be 1.5 μm, but as a result of study on laser devices having this device structure with different widths of the ridge stripe, it was confirmed that, if the ridge stripe width was 3 μm or smaller, the laser device oscillates with the polarization direction being stable.

Next, the ambient temperature was raised and current-light output characteristics were measured. As a result, a great increase in the threshold current in relation to temperature rise was observed with regard to the laser devices of Samples 1-5, 1-6, 1-7, 1-8, 1-9, 1-10, 1-11, 1-12, 1-13, and 1-14 compared with samples having other structures. Further, when the applied current was increased when the ambient temperature was about 50° C., a phenomenon in which light emission suddenly stopped and light emission was not recognized even after current was caused to flow therethrough once again was observed. A plurality of devices having the same structure were manufactured with regard to the respective structures and the measurement was made. Such a phenomenon was observed in 80% to 90% of the plurality of laser devices corresponding to Samples 1-5, 1-6, 1-7, 1-8, 1-9, 1-10, 1-11, and 1-14 and 40% to 60% of the plurality of laser devices corresponding to Samples 1-12 and 1-13.

Not only the plurality of laser devices manufactured so as to have the structures shown in Table 1 but also a plurality of laser devices having structures other than those shown in Table 1 were manufactured. As a result of evaluating the characteristics of the laser devices, the following laws were discovered.

Figure 1:
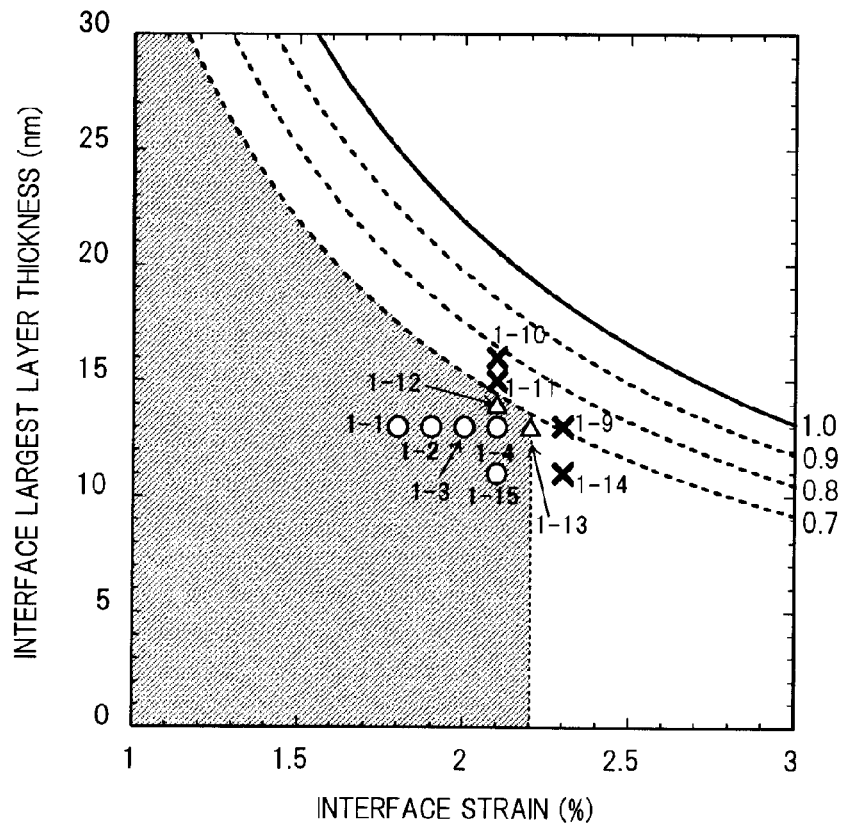
FIG. 1 is a graph illustrating a relationship between a magnitude of interface strain and an interface largest layer thickness of a semiconductor electroluminescent device according to an embodiment of the present invention.

FIG. 1 is a graph illustrating the relationship between the magnitude of interface strain and interface largest layer thickness. In FIG. 1, interface strain $\epsilon_{kai}$ is defined as $\epsilon_w - \epsilon_b$. The magnitude of the interface strain $\epsilon_{kai}$ is the horizontal axis of the graph. Interface largest layer thickness $t_{kai}$ is defined as the larger one of the thickness of a well layer and the thickness of a barrier layer that are adjacent to each other with an interface therebetween, which is the vertical axis of the graph. In the structures of the MQW layer 4 shown in Table 1, the thickness $L_w$ of the plurality of well layers and the thickness $L_b$ of the plurality of barrier layers included in the MQW layer 4 are fixed, respectively, and the thickness $L_w$ of the well layers is larger than the thickness $L_b$ of the barrier layers, and thus, the interface largest layer thickness $t_{kai}$ is the thickness $L_w$ of the well layers.

Curves illustrated in FIG. 1 are drawn by assigning the interface largest layer thickness $t_{kai}$ in Matthews' formula expressed as Equation 1 and determining the magnitude of the interface strain $C_{kai}$ according to Matthews' formula. The relationship is expressed as the following Expression (2):

[Equation 2]

$$|\varepsilon_{kai}| = \frac{b}{2\pi \cdot t_{kai}} \frac{1-v\cos^2\psi}{(1+v)\cos\phi}\left[\ln\left(\frac{t_{kai}}{b}\right)+1\right] \times A \quad (2)$$

In Expression (2), b is 0.4 nm, cos Ψ is 0.5, cos Φ is 0.5, and v is ⅓. Further, the four curves illustrated in FIG. 1 are with regard to cases in which A is 0.7, 0.8, 0.9, and 1.0, respectively.

As a result of evaluating the characteristics of the above-mentioned plurality of laser devices, it was made clear that critical interface strain is thought to be determined by Expression (2) when A=0.7, and the interface strain $\varepsilon_{kai}$ is desirably made to be equal to or smaller than the critical interface strain.

Figure 4:
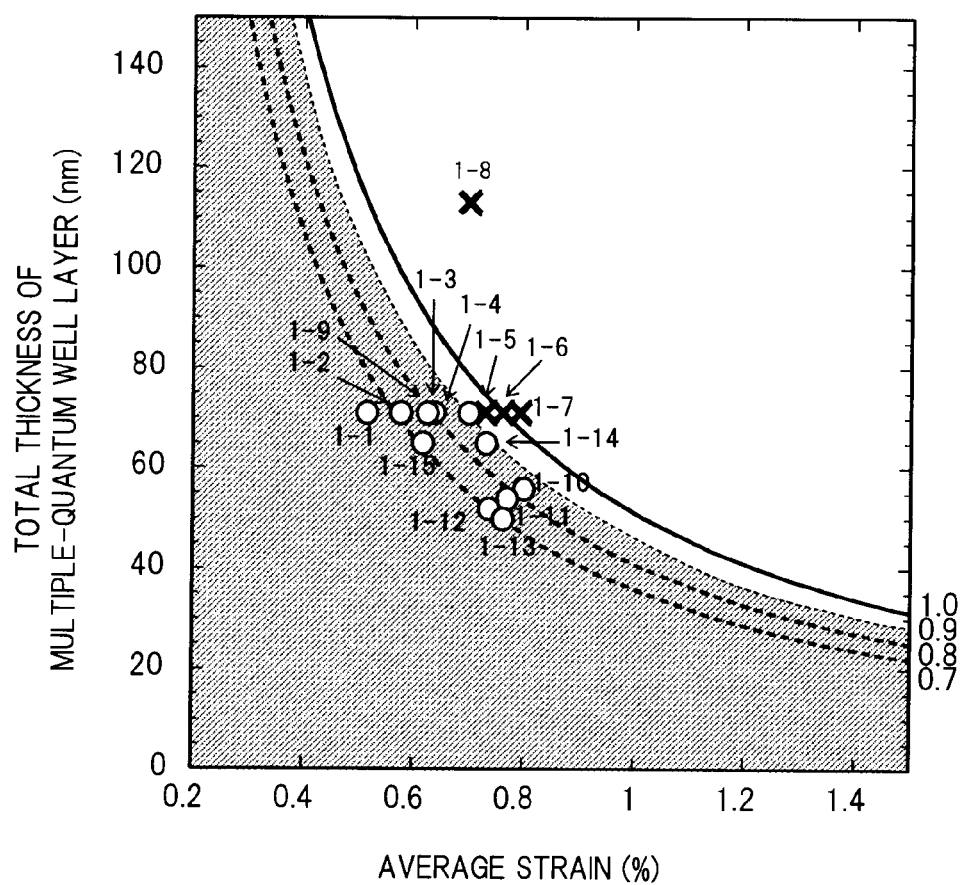
FIG. 4 is a graph illustrating a relationship between a magnitude of average strain in the multiple-quantum well layer and a total thickness of the multiple-quantum well layer of the semiconductor electroluminescent device according to the embodiment of the present invention.

FIG. 4 is a graph illustrating the relationship between the magnitude of the average strain and the total thickness of the MQW layer 4. Here, the total thickness $t_{tot}$ of the MQW layer 4 and the average strain $\varepsilon_{av}$ are defined by the following Expressions (3) and (4), respectively. The average strain $\varepsilon_{av}$ is the horizontal axis and the total thickness $t_{tot}$ is the vertical axis in FIG. 4.

[Equation 3]

$$t_{tot} = N_w L_w + (N_w+1)L_b \quad (3)$$

$$\varepsilon_{av} = \frac{N_w \varepsilon_w L_w + (N_w+1)\varepsilon_b L_b}{N_w L_w + (N_w+1)L_b} \quad (4)$$

Further, curves illustrated in FIG. 4 are drawn by assigning the total thickness $t_{tot}$ in Matthews' formula expressed as Equation 1 and determining the magnitude of the average strain $\varepsilon_{av}$ according to Matthews' formula. The relationship is expressed as the following Expression (5):

[Equation 4]

$$|\varepsilon_{av}| = \frac{b}{2\pi \cdot t_{tot}} \frac{1-v\cos^2\psi}{(1+v)\cos\phi}\left[\ln\left(\frac{t_{tot}}{b}\right)+1\right] \times B \quad (5)$$

In Expression (5), similarly to the case of FIG. 1, b is 0.4 nm, cos Ψ is 0.5, cos Φ is 0.5, and v is ⅓. Further, the four curves illustrated in FIG. 4 are with regard to cases in which B is 0.7, 0.8, 0.9, and 1.0, respectively.

As a result of evaluating the characteristics of the above-mentioned plurality of laser devices, it was made clear that critical average strain is thought to be determined by Expression (5) when B=0.9, and the average strain $\varepsilon_{av}$ is more desirably made to be equal to or smaller than the critical average strain. In FIG. 4, samples which satisfy the conditions are denoted by a symbol ○ while samples which do not satisfy the conditions are denoted by a symbol x. For example, Samples 1-5, 1-6, 1-7, and 1-8 are above the curve B=0.9, and are denoted by the symbol x.

As described above, after the epitaxial growth, a crosshatch was recognized on the upper surfaces of Samples 1-5, 1-6, 1-7, 1-8, 1-9, 1-10, and 1-11. The laser devices actually manufactured so as to have the structures were broken when the characteristics were measured. It is desirable that those structures of the MQW layer 4 be designed so as not to exceed the above-mentioned conditions.

Further, with regard to Sample 1-14 which satisfied the above-mentioned conditions but in which a crosshatch was similarly observed and which was broken when the characteristics were measured, study was made, and it was found that, even when the structures of the MQW layer satisfy the above-mentioned conditions, if the magnitude of the interface strain $\varepsilon_{kai}$ is larger than 2.2%, the MQW layer was broken when the characteristics were measured. Therefore, it is more desirable that the design be performed such that the magnitude of the interface strain $\varepsilon_{kai}$ is 2.2% or smaller. From this, a condition to be satisfied by a composition amount 1−x−y of In in the well layers can be experimentally determined as 1−x−y≥0.21.

It is to be noted that, in FIG. 1, samples which satisfy the conditions are denoted by the symbol ○, samples which do not fully satisfy the conditions are denoted by a symbol Δ, and samples which do not satisfy the conditions are denoted by the symbol x. For example, as illustrated in FIG. 1, Samples 1-9, 1-10, and 1-11 are above a curve A=0.7, and are denoted by the symbol x.

It is to be noted that the structures of the MQW layer 4 shown in Table 1 are based on the following findings. In order to regard the state of electrons in a quantum well layer as a two-dimensional electron system, according to a simple free electron model theory, the thickness of the quantum well layer is required to satisfy $L_w \leq 1/k_F$, where $k_F$ is a Fermi wave number of carriers in the quantum well layer. This makes it clear that the thickness of the well layer is required to be thinner than 16 nm at largest. With this condition being satisfied, the splitting energy of the LH band and the HH band when tensile strain is introduced into the well layer is represented by $E_{lh}-E_{hh}$.

Figure 2:
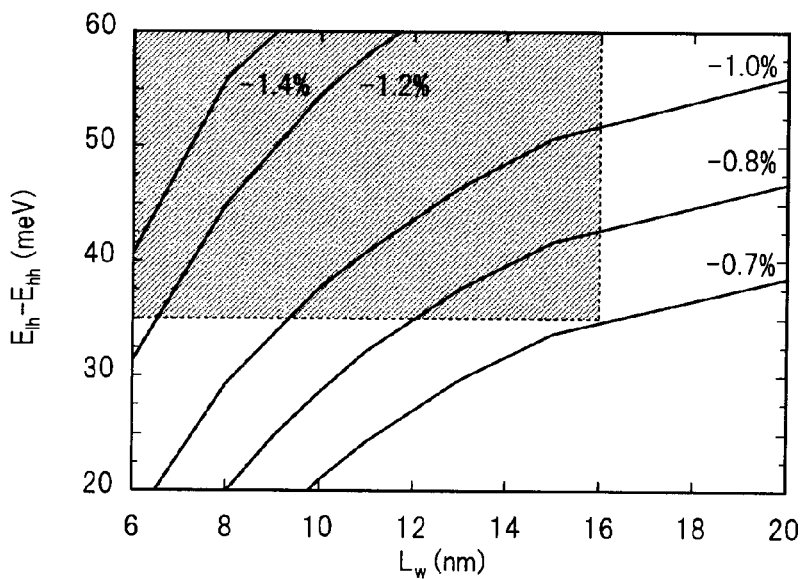
FIG. 2 is a graph of dependence of splitting energy on a thickness of a well layer and on a strain amount of the well layer in a multiple-quantum well layer of the semiconductor electroluminescent device according to the embodiment of the present invention.

FIG. 2 illustrates the results of calculation of the dependence of the splitting energy $E_{lh}-E_{hh}$ on the thickness $L_w$ of the well layer and on the strain amount $\varepsilon_w$ of the well layer. It is to be noted that a plurality of curves in FIG. 2 correspond to respective values of the strain amount $\varepsilon_w$ of the well layer. As illustrated in FIG. 2, it is clear that the larger the thickness $L_w$ of the well layer is, and the larger the magnitude of the strain amount $\varepsilon_w$ of the well layer is, the larger the splitting energy $E_{lh}-E_{hh}$ becomes. In particular, in order to make laser oscillation occur even when the ambient temperature is as high as about 100° C., the LH band and the HH band are required to be sufficiently split. In order to attain this, taking into consideration the temperature rise of the active layer due to current passing therethrough, it is desirable that the splitting energy $E_{lh}-E_{hh}$ is 35 meV (equivalent to 130° C. in terms of temperature) or larger.

From the above, it is desirable that the thickness $L_w$ of the well layer is 16 nm or smaller and the magnitude of the strain amount $\varepsilon_w$ of the well layer is 0.7% or larger. This range is shown by broken lines in FIG. 2. From FIG. 2, a condition to be satisfied by the composition amount 1−x−y of In in the well layer is experimentally obtained as 1−x−y≥0.44. Taking into consideration a case in which the compressive strain imposed on the barrier layer is at the minimum, it is desirable that the magnitude of the interface strain $\varepsilon_{kai}$ is also at least 0.7% or larger.

In addition to the laser devices having the structures shown in Table 1, laser devices having various structures including cases in which the thickness $L_w$ of the well layer differed from one layer to another were manufactured, and similar experiments were carried out.

Generally, an i-th barrier layer and an (i+1)th barrier layer are provided in contact with an i-th well layer, and interfaces are formed therebetween, respectively. When the thickness of the i-th well layer is represented by $L_w^i$ and the thickness of the i-th barrier layer is represented by $L_b^i$, the interface strain $\epsilon_{kai}$ at the interface between the i-th well layer and the i-th barrier layer is expressed as $\epsilon_w^i - \epsilon_b^i$, and the interface largest layer thickness $t_{kai}$ at the interface is the larger one of $L_w^i$ and $L_b^1$. Similarly, the interface strain $\epsilon_{kai}$ at the interface between the i-th well layer and the (i+1)th barrier layer is expressed as $\epsilon_w^i - \epsilon_b^{i+1}$, and the interface largest layer thickness $t_{kai}$ at the interface is the larger one of $L_w^i$ and $L_b^{i+1}$.

Further, generally, the total thickness $t_{tot}$ and the average strain $\epsilon_{av}$ are defined by the following Expressions (6) and (7), respectively.

[Equation 5]

$$t_{tot} = \sum_{i=1}^{N_w} L_w^i + \sum_{i=1}^{N_w+1} L_b^i \quad (6)$$

$$\varepsilon_{av} = \left\{ \frac{\sum_{i=1}^{N_w} \varepsilon_w^i L_w^i + \sum_{i=1}^{N_w+1} \varepsilon_b^i L_b^i}{\sum_{i=1}^{N_w} L_w^i + \sum_{i=1}^{N_w+1} L_b^i} \right\} \quad (7)$$

With regard to laser devices having satisfactory characteristics among the laser devices having the above-mentioned various structures, the interface strain $\epsilon_{kai}$ at each of the interfaces in the MQW layer 4 satisfies the condition of being equal to or smaller than the critical interface strain determined by Expression (2) when A=0.7, and the average strain $\epsilon_{av}$ satisfies the condition of being equal to or smaller than the critical average strain determined by Expression (5) when B=0.9. Further, it is more desirable that the magnitude of the interface strain $\epsilon_{kai}$ at each of the interfaces is 0.7% or larger and 2.2% or smaller, and it is still more desirable that the composition amount 1−x−y of In in the well layer is 0.21 or larger and 0.44 or smaller.

It is to be noted that Japanese Patent Application Laid-Open No. 2005-175295 describes an example in which a device having satisfactory characteristics was obtained under the conditions that the number $N_w$ of the well layers in the MQW layer was 9, the thickness $L_w$ of the well layer was 8 nm, the thickness $L_b$ of the barrier layer was 10 nm, the strain amount $\epsilon_w$ of the well layer was −1.0%, the strain amount $\epsilon_b$ of the barrier layer was 0.0%, and the composition wavelength $\lambda_b$ of the barrier layer was 1,000 nm. The device does not satisfy the conditions described in this embodiment. However, because the composition amount 1−x−y of In in the well layer is 0.52, the splitting energy of the LH band and the HH band is about 28 meV (50° C.). Taking into consideration the temperature rise of the active layer due to current passing therethrough, the device can have satisfactory characteristics only when the ambient temperature is at room temperature or lower, and thus, the conditions for the device are different from the conditions for securing the characteristics in a wide temperature range as those for a semiconductor electroluminescent device according to the present invention. Further, there are cases in which, even if the conditions described in this embodiment are not satisfied, depending on the location in the wafer used in epitaxial growth, some semiconductor electroluminescent devices which can secure reliability can be obtained. However, in order to attain the yield, uniformity, reproducibility, and mass productivity of the characteristics, the conditions described in this embodiment are still necessary. Further, while, in the present invention, conditions for obtaining with stability a wafer in which an MQW layer is formed by epitaxial growth on an InP substrate and for making it possible to manufacture a high-performance and highly reliable device in a wide temperature range up to 100° C. are described, the device according to Japanese Patent Application Laid-Open No. 2005-175295 has a embedded structure, and thus, the circumstances are different from those with respect to the above-mentioned conditions.

In addition, Japanese Patent Application Laid-Open No. Hei 05-206575 describes an $In_{1-x-y}Ga_xAl_yAs$-based well layer having tensile strain. However, the composition amount 1−x−y of In in the well layer is in a range of 0.45 to 0.53, and the number of the well layers in the MQW layer and information on the barrier layer in the MQW layer are not disclosed, and thus, there is no suggestion with regard to the present invention.

Second Embodiment

A semiconductor electroluminescent device according to a second embodiment of the present invention is the ridge stripe Fabry-Perot laser device according to the first embodiment which additionally considers the composition of the barrier layers.

Here, when a well layer has compressive strain, as described above, an HH band contributes to oscillation. The effective mass of the HH band is sufficiently larger than the effective mass of a conduction band. Therefore, in order to suppress carrier overflow, to make larger a band offset $\Delta E_c$ of the conduction band conventionally receives attention. For example, Zah et al., IEEE J. Quantum. Electro., Vol. 30, No. 2, pp. 511-523 sets up a condition on the band offset of the conduction band: $\Delta E_c \geq 150$ meV. However, when a well layer has tensile strain, an LH band contributes to oscillation. The effective mass of the LH band in the direction of crystal growth in each layer of the MQW layer becomes smaller substantially to the level of the effective mass of carriers in the conduction band. Therefore, with regard a well layer having tensile strain, it is desirable that a band offset $\Delta E_v$ of a valence band is made to be sufficiently large, and it is more desirable that $\Delta \xi_v$ is made to be sufficiently large, wherein $\Delta \xi_v$ is the difference between energy of a first state of a valence band of a well layer and energy at the band edge of a valence band of a barrier layer. Conventionally, $\Delta \xi_v$ does not receive attention.

TABLE 2

| Sample no. | $N_w$ | $L_w$ (nm) | $L_b$ (nm) | $\epsilon_w$ (%) | $\epsilon_b$ (%) | Composition of barrier layer | |
|---|---|---|---|---|---|---|---|
| | | | | | | x | y |
| 2-1 | 3 | 8 | 10 | −1.5 | +0.3 | 0.143 | 0.287 |
| 2-2 | 3 | 8 | 10 | −1.5 | +0.3 | 0.208 | 0.221 |

Table 2 shows the structures of the MQW layer 4 with regard to laser devices of examples according to this embodiment and comparative examples, respectively. By the manufacturing method described in the first embodiment, a plurality of wafers are manufactured so as to have the structures shown in Table 2, and a plurality of laser devices are manufactured using those wafers. The characteristics of the plurality of laser devices are to be described in the following.

With regard to the plurality of wafers manufactured so as to have the structures shown in Table 2, the luminescence wavelength was determined by photoluminescence. With regard to all the wafers, one oscillation peak was observed at about 1.3 µm.

With regard to the laser devices manufactured using those wafers, similarly to the case of the laser devices according to the first embodiment, current-light output characteristics were measured. At 25° C., the threshold current of the laser devices of both of Samples 2-1 and 2-2 was on the order of 5 mA. Satisfactory characteristics were attained and almost no difference was observed. However, when the temperature was raised and measurement was made at about 95° C., while the laser devices of Sample 2-1 oscillated with the threshold current being 9 mA, some of the laser devices of Sample 2-2 oscillated with the threshold current being larger than 40 mA and some of the laser devices of Sample 2-2 did not oscillate, and the characteristics were nonuniform. Further, with regard to the devices of Sample 2-1, when the ambient temperature was raised to 100° C. and measurement was made, oscillation was recognized.

Comparison is made between laser devices of the two samples shown in Table 2. The main difference resides in the composition of the barrier layers. Therefore, the band structures of the quantum well layers of the laser devices were experimentally studied.

Figure 5A:
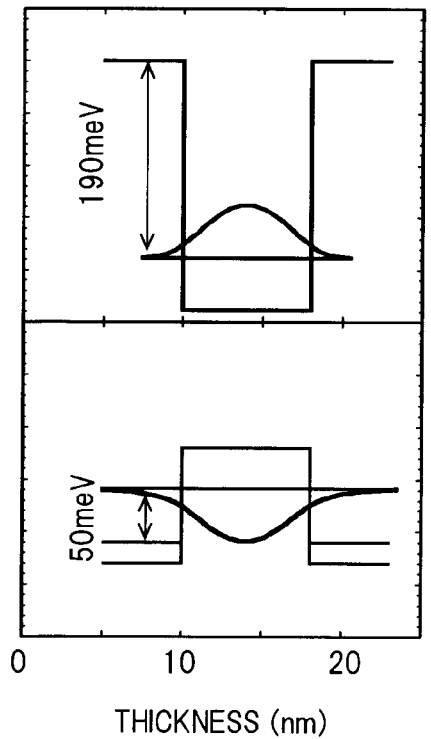
FIGS. 5A and 5B are schematic views illustrating band structures of well layers of semiconductor electroluminescent devices according to another embodiment of the present invention.
Figure 5B:
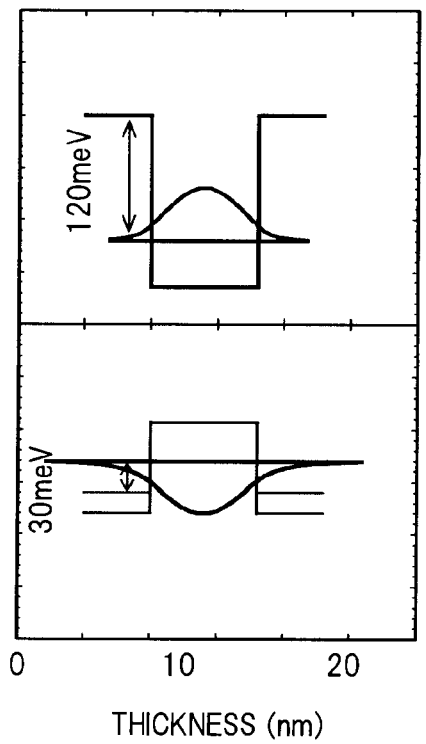

FIGS. 5A and 5B are schematic views illustrating band structures of the quantum well layers of the samples shown in Table 2. Here, FIG. 5A corresponds to the electron structure of the quantum well layer of Sample 2-1 while FIG. 5B corresponds to the electron structure of the quantum well layer of Sample 2-2. It is to be noted that, for the sake of simplicity of description, only a first state of a conduction band and a first state of a valence band are illustrated for one quantum well.

As illustrated in FIGS. 5A and 5B, while, in Sample 2-1, a difference $\Delta\xi_c$ between energy $\xi_w$ of the first state of the conduction band of the well layer and energy $\xi_{bc}$ of the conduction band of the barrier layer ($=\xi_{bc}-\xi_w$) is 190 meV, in Sample 2-2, $\Delta\xi_c$ is 120 meV, which is smaller. While, in Sample 2-1, a difference $\Delta\xi_v$ between energy $\xi_v$ of the first state of the valence band of the well layer and energy $\xi_{bv}$ of the valence band of the barrier layer ($=\xi_v-\xi_{bv}$) is 50 meV, in Sample 2-2, $\Delta\xi_v$ is 30 meV, which is smaller.

As described above, when a well layer has tensile strain, an LH band contributes to oscillation, and the effective mass of the carriers becomes smaller substantially to the level of the effective mass of the carriers in the conduction band. Therefore, it is thought that the laser devices of Sample 2-2 did not oscillate at a high temperature not because $\Delta\xi_c$ was small but because $\Delta\xi_v$ was small and the carriers overflowed.

This makes it clear that, in a semiconductor electroluminescent device in which a well layer has tensile strain, in order to improve the temperature characteristics, taking into consideration not only $\Delta\xi_c$ but also $\Delta\xi_v$ in designing is desirable. This is in contrast to a case of a conventional device with a well layer having compressive strain, in which, because an HH band contributes to oscillation and the effective mass of the carriers in the HH band is sufficiently larger than the effective mass of the carriers in the conduction band, in order to improve the temperature characteristics of the device, attention is focused only on $\Delta\xi_c$ and the design is performed such that $\Delta\xi_c$ becomes larger.

Figure 6:
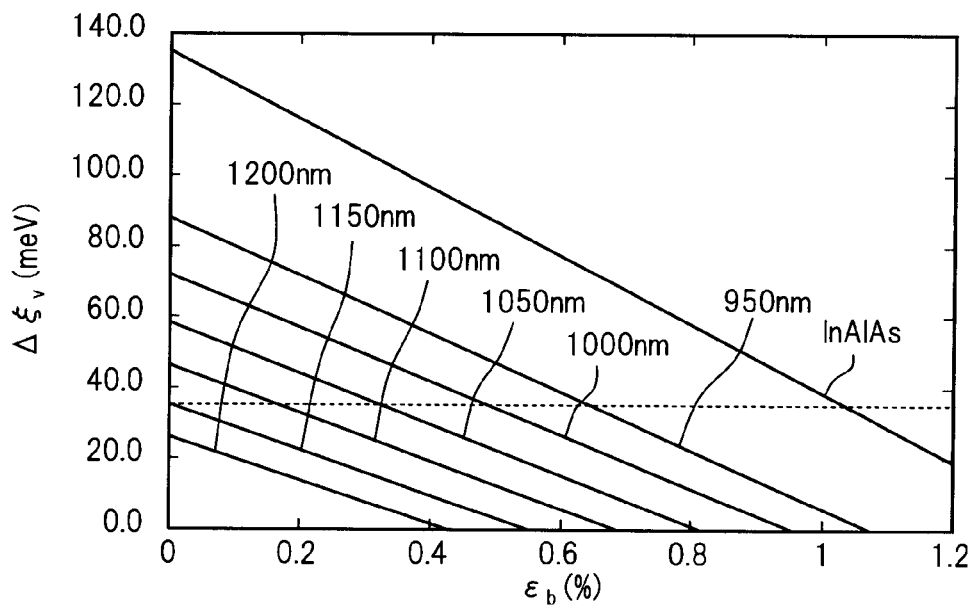
FIG. 6 is a graph of dependence of energy difference $\Delta \xi_v$ on a strain amount of a barrier layer of the semiconductor electroluminescent device according to the another embodiment of the present invention.

FIG. 6 is a graph of dependence of $\Delta\xi_v$ on the strain amount $\epsilon_b$ of the barrier layer with respect to various composition wavelengths $\lambda_b$ of the barrier layer. It is to be noted that a plurality of curves in FIG. 6 correspond to respective values of the composition wavelength $\lambda_b$ of the barrier layer. FIG. 6 shows that, the smaller the magnitude of the strain amount $\epsilon_b$ is, and the shorter the composition wavelength $\lambda_b$ of the barrier layer is, the larger $\Delta\xi_v$ becomes.

In order to attain satisfactory characteristics at a temperature as high as about 100° C., similarly to the case of the splitting energy $E_{lh}-E_{hh}$ described in the first embodiment, it is desirable that $\Delta\xi_v$ is 35 meV (130° C.) or larger.

Figure 7:
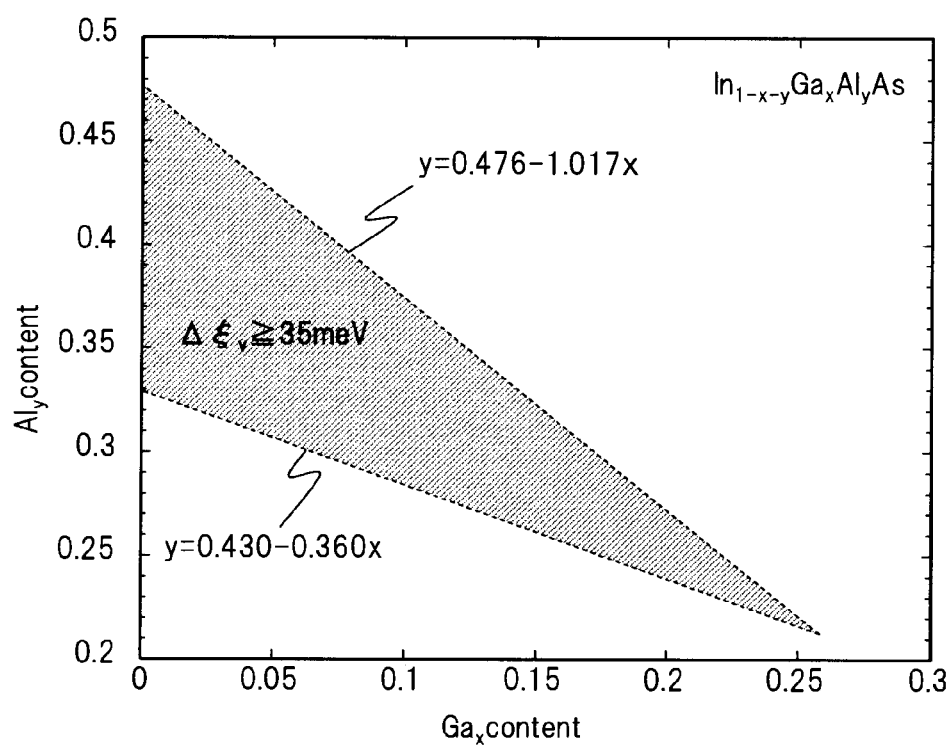
FIG. 7 is a phase graph illustrating a range of a composition amount of the barrier layer of the semiconductor electroluminescent device according to the another embodiment of the present invention.

The range of the composition of the barrier layer when $\Delta\xi_v$ is 35 meV or larger is experimentally determined. This is attained when a composition amount y of Al in the barrier layer is 0.430-0.360x or larger and 0.476-1.017x or smaller. $\Delta\xi_v$ of Sample 2-1 in which the composition amount y of Al in the barrier layer is within this range satisfies this condition. FIG. 7 is a phase diagram illustrating the range in which a composition amount x of Ga and the composition amount y of Al in the barrier layer satisfy the above-mentioned condition.

As described above, it is thought that, conventionally, because the condition on $\Delta\xi_v$ is vague in an InGaAlAs-based semiconductor electroluminescent device in the 1.3 µm band with a well layer having tensile strain, satisfactory characteristics can not be attained with stability in a wide temperature range.

Third Embodiment

A semiconductor electroluminescent device according to a third embodiment of the present invention is the ridge stripe Fabry-Perot laser device according to the first embodiment which additionally considers the number $N_w$ of the well layers in the MQW layer 4.

A great difference is observed in saturation current $I_{sat}$ among a plurality of semiconductor electroluminescent devices of examples according to the first embodiment and comparative examples. With regard to an $In_{1-x-y}Ga_xAl_yAs$-based ridge stripe Fabry-Perot laser device in the 1.3 µm band with a well layer having compressive strain which is now dominant, when the width of a mesa is 1.5 µm, the length of a resonator is 200 µm, and the reflectivities of coating on a front end surface and a rear end surface are 40% and 90%, respectively, the saturation current $I_{sat}$ is larger than 125 mA at 85° C. Therefore, with regard to an InGaAlAs-based semiconductor electroluminescent device in the 1.3 µm band with a well layer having tensile strain, also, it is desirable that the saturation current $I_{sat}$ is larger than 125 mA at least under the same conditions. A condition for making the saturation current $I_{sat}$ 125 mA at 85° C. is determined from the results of an experiment of laser devices of samples manufactured so as to have structures shown in Table 3.

TABLE 3

| Sample no. | $N_w$ | $L_w$ (nm) | $L_b$ (nm) | $\epsilon_w$ (%) | $\epsilon_b$ (%) | Composition of barrier layer x | Composition of barrier layer y |
|---|---|---|---|---|---|---|---|
| 3-1 | 3 | 11 | 10 | −1.3 | +0.5 | 0.098 | 0.303 |
| 3-2 | 4 | 11 | 10 | −1.3 | +0.5 | 0.098 | 0.303 |
| 3-3 | 5 | 11 | 10 | −1.3 | +0.5 | 0.098 | 0.303 |
| 3-4 | 5 | 10 | 10 | −1.4 | +0.5 | 0.098 | 0.303 |
| 3-5 | 5 | 9 | 10 | −1.5 | +0.5 | 0.098 | 0.303 |
| 3-6 | 5 | 8 | 10 | −1.5 | +0.5 | 0.098 | 0.303 |
| 3-7 | 6 | 11 | 10 | −1.3 | +0.5 | 0.098 | 0.303 |

Table 3 shows the structures of the MQW layer 4 with regard to a plurality of laser devices of examples according to this embodiment and comparative examples. All of the structures of the MQW layer 4 satisfy the conditions described in the first and second embodiments. By the manufacturing method described in the first embodiment, wafers were manufactured so as to have the structures shown in Table 3. Upper surfaces of the manufactured wafers were studied by visual inspection. With regard to all the wafers, the upper surface was in a mirror-smooth state.

Luminescence wavelengths of the plurality of wafers manufactured so as to have the structures shown in Table 3 were determined by photoluminescence. With regard to the wafers of Samples 3-1, 3-2, 3-3, and 3-7, one oscillation peak at about 1.3 μm and another oscillation peak which was smaller in strength and was on the side of a shorter wavelength thereof were observed. In all of those cases, the splitting energy $E_{lh}$-$E_{hh}$ was equal to or larger than 40 meV. With regard to the two oscillation peaks, the oscillation peak at about 1.3 μm is thought to be due to the LH band while the oscillation peak on the side of a shorter wavelength is thought to be due to the HH band. With regard to the wafers of Samples 3-4, 3-5, and 3-6, one oscillation peak at about 1.3 μm was observed.

Further, ridge stripe Fabry-Perot laser devices were manufactured using those wafers by the above-mentioned manufacturing method, and the following measurement was made.

Figure 8:
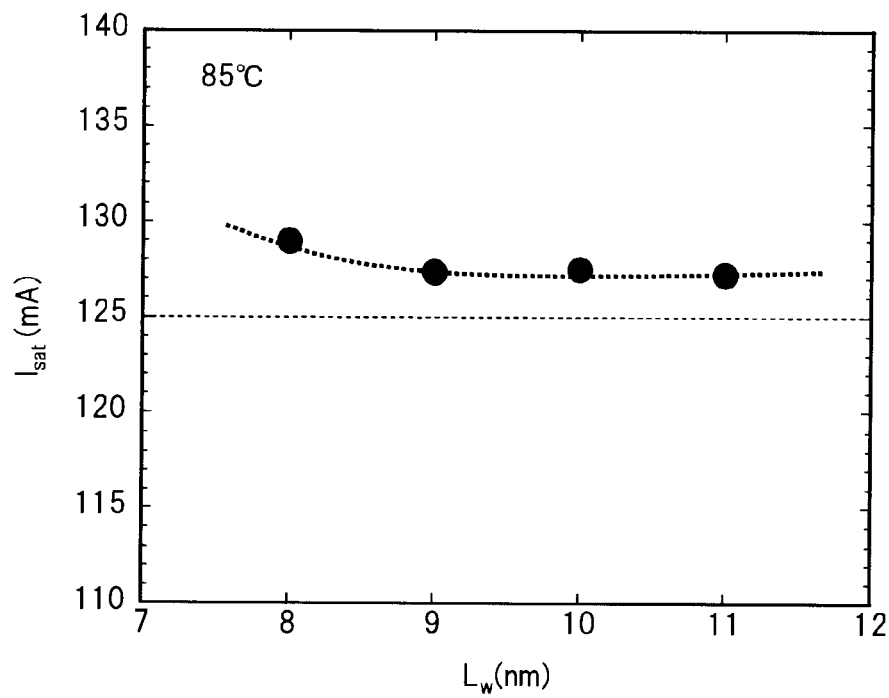
FIG. 8 is a graph of dependence of saturation current on a thickness of a well layer of a semiconductor electroluminescent device according to still another embodiment of the present invention.

FIG. 8 is a graph of dependence of the saturation current $I_{sat}$ on the thickness $L_w$ of the well layer at 85° C. As illustrated in FIG. 8, when the thickness $L_w$ of the well layer is in a range of 8 nm to 11 nm, the saturation current $I_{sat}$ is almost constant independently of the thickness $L_w$ of the well layer.

Figure 9:
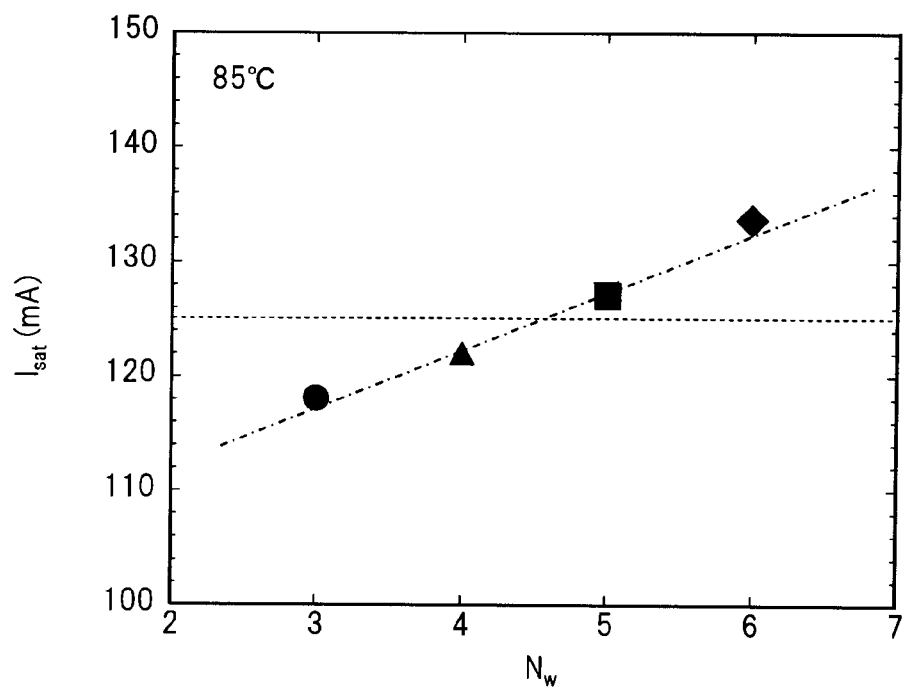
FIG. 9 is a graph of dependence of saturation current on the number of the well layers of the semiconductor electroluminescent device according to the still another embodiment of the present invention.

FIG. 9 is a graph of dependence of the saturation current $I_{sat}$ on the number $N_w$ of the well layers at 85° C. As illustrated in FIG. 9, the saturation current $I_{sat}$ is substantially in proportion to the number $N_w$ of the well layers. In order to attain the saturation current $I_{sat}$ of 125 mA or larger at 85° C., the necessary number of the well layers is 5 or larger.

With this, even a resonator having a luminescence wave length as short as 300 μm or shorter can realize high power and high-speed operation in a wide temperature range. Wang et al., Electron. Lett., Vol. 30, No. 17, pp. 1413-1414 reports a conventional case in which the number $N_w$ of the well layers is 5, but information on the barrier layer is not disclosed, and thus, there is no suggestion with regard to the present invention.

Fourth Embodiment

In the above description, all the well layers in the MQW layer 4 are designed to have uniform composition. However, the present invention is not limited thereto. Well layers in the MQW layer 4 of a semiconductor electroluminescent device according to a fourth embodiment of the present invention are multilayered, more specifically, three-layered.

TABLE 4

| Sample no. | $N_w$ | $L_w^{tot}$ (nm) | $L_w$ (nm) | $\epsilon_w$ (%) | $\epsilon_w^{av}$ (%) | $L_b$ (nm) | $\epsilon_b$ (%) |
|---|---|---|---|---|---|---|---|
| 4-1 | 3 | 13 | 3 | −1.35 | −1.6 | 10 | +0.6 |
|  |  |  | 7 | −1.8 |  |  |  |
|  |  |  | 3 | −1.35 |  |  |  |
| 4-2 | 3 | 13 | 2 | −1.35 | −1.6 | 10 | +0.7 |
|  |  |  | 9 | −1.7 |  |  |  |
|  |  |  | 2 | −1.35 |  |  |  |

TABLE 4-continued

| Sample no. | $N_w$ | $L_w^{tot}$ (nm) | $L_w$ (nm) | $\epsilon_w$ (%) | $\epsilon_w^{av}$ (%) | $L_b$ (nm) | $\epsilon_b$ (%) |
|---|---|---|---|---|---|---|---|
| 4-3 | 2 | 16 | 6 | −1.4 | −1.5 | 10 | +0.7 |
|  |  |  | 6 | −1.7 |  |  |  |
|  |  |  | 6 | −1.4 |  |  |  |
| 4-4 | 4 | 12 | 3 | −1.4 | −1.5 | 10 | +0.6 |
|  |  |  | 6 | −1.6 |  |  |  |
|  |  |  | 3 | −1.4 |  |  |  |
| 4-5 | 3 | 13 | 3 | −1.7 | −1.6 | 10 | +0.6 |
|  |  |  | 7 | −1.5 |  |  |  |
|  |  |  | 3 | −1.7 |  |  |  |

Table 4 shows the structures of the MQW layer 4 with regard to a plurality of laser devices of examples according to this embodiment and comparative examples. The well layers in the MQW layer 4 are multilayered, more specifically, three-layered.

Here, the thickness of each one of the plurality of layers forming each well layer is denoted as $L_w$, and the total thickness of each well layer formed of the plurality of layers is denoted as $L_w^{tot}$. Further, the strain amount of each of the plurality of layers forming each well layer is denoted as $\epsilon_w$, and the average strain amount of each well layer formed of the plurality of layers is denoted as $\epsilon_w^{av}$.

By the manufacturing method described in the first embodiment, a plurality of wafers were manufactured such that the MQW layer 4 had the structures shown in Table 4. It is to be noted that, with regard to all the samples, the barrier layers of the MQW layer 4 are formed of $In_{1-x-y}Ga_xAl_yAs$ such that the composition wavelength $\lambda_b$ is 900 nm when no strain is imposed thereon.

With regard to the plurality of wafers manufactured as described above, the luminescence wavelength was determined by photoluminescence. With regard to all the wafers, a broad oscillation peak with some shoulders was observed at about 1.3 μm. Further, visual inspection of upper surfaces of the wafers was made. The upper surfaces of Samples 4-1, 4-2, and 4-5 were in a mirror-smooth state. A slight crosshatch was observed on the upper surfaces of Samples 4-3 and 4-4.

With regard to the laser devices manufactured using those wafers, current-light output characteristics were measured. At 25° C., oscillation was recognized with regard to all the manufactured samples. Further, with regard to all the laser devices, TM mode oscillation was recognized.

Next, the ambient temperature was raised and current-light output characteristics were measured. As a result, a great increase in the threshold current in relation to temperature rise was observed with regard to the laser devices of Samples 4-2, 4-3, 4-4, and 4-5 compared with samples having other structures. Further, when the applied current was increased when the ambient temperature was about 50° C., a phenomenon in which light emission suddenly stopped and light emission was not recognized even after current was caused to flow therethrough once again was observed. A plurality of devices having the same structure were manufactured with regard to the respective structures and the measurement was made. Such a phenomenon was observed in 90% of the plurality of laser devices of Samples 4-3, 4-4, and 4-5 and 70% of the plurality of laser devices of Sample 4-2.

Not only the plurality of laser devices manufactured so as to have the structures shown in Table 4 but also a plurality of laser devices having structures other than those shown in Table 4 were manufactured. As a result of evaluating the characteristics of the laser devices, the following laws were discovered.

In addition to ordinary interface strain, interface strain $\epsilon_{kai}$ at the interface between a multilayered well layer and a barrier layer adjacent to the well layer defined as $\epsilon_w^{av}$-$\epsilon_b$ is introduced. Further, interface largest layer thickness $t_{kai}$ is defined as the larger one of the total thickness $L_w^{tot}$ of the well layer and the thickness $L_b$ of the barrier layer. Similarly to the case of the semiconductor electroluminescent devices according to the first embodiment, the critical interface strain is determined by Expression (2) when A=0.7. It was made clear that the interface strain $\epsilon_{kai}$ was desirably made to be equal to or smaller than the critical interface strain.

Further, the total thickness $t_{tot}$ and the average strain $\epsilon_{av}$ of the MQW layer 4 are defined as Expression (3) and Expression (4), with $L_w^{tot}$ and $\epsilon_w^{av}$ therein being substituted for $L_w$ and $\epsilon_w$, respectively. Similarly, the critical average strain is determined by Expression (5) when B=0.9. It was made clear that the average strain $\epsilon_{av}$ was more desirably made to be equal to or smaller than the critical average strain.

As described above, after the epitaxial growth, a crosshatch was recognized on the upper surfaces of Samples 4-3 and 4-4. The laser devices actually manufactured so as to have those structures were broken when the characteristics were measured. It is desirable that the structures of the MQW layer 4 be designed so as not to exceed the above-mentioned conditions.

Further, with regard to Samples 4-2 and 4-5 which satisfied the above-mentioned conditions but were broken when the characteristics were measured, study was made. It was discovered that, even when the structures of the MQW layer satisfy the above-mentioned conditions, if the magnitude of the interface strain $\xi_{kai}$ (in the case of Sample 4-2) or the magnitude of the strain $\epsilon(=\epsilon_w-\epsilon_b)$ at the interface between layers adjacent to each other (in the case of Sample 4-5) is larger than 2.2%, the multilayered structure was broken when the characteristics were measured. Therefore, it is desirable that the design be performed such that both the magnitude of the interface strain $\epsilon_{kai}$ and the magnitude of the strain $\epsilon$ at the interface between layers adjacent to each other are 2.2% or smaller.

In addition to the laser devices having the structures shown in Table 4, laser devices having various structures including cases in which the structure of the well layers and the structure of the barrier layers differed from one layer to another were manufactured, and similar experiments were carried out. In this case, also, when the total thickness of the i-th well layer is represented by $(L_w^{tot})^i$ and the average strain of the i-th well layer is represented by $(\epsilon_w^{av})^i$ and when those were substituted for the total thickness $t_{tot}$ of the MQW layer 4 and the average strain $\epsilon_{av}$ in Expressions (6) and (7), it was made clear that the above-mentioned conditions were appropriate.

More specifically, in the MQW layer 4, even when the composition of a well layer sandwiched between barrier layers is not uniform in the direction of crystal growth, the well layer as a whole has tensile strain, and it is more desirable that the interface strain between the average strain of the well layer as a whole and the strain imposed on a barrier layer adjacent thereto satisfies the above-mentioned conditions.

Fifth Embodiment

Similarly, all the barrier layers in the MQW layer 4 are also not limited to having uniform composition. Barrier layers in the MQW layer 4 of a semiconductor electroluminescent device according to a fifth embodiment of the present invention are multilayered, more specifically, three-layered.

TABLE 5

| Sample no. | $N_w$ | $L_w$ (nm) | $\epsilon_w$ (%) | $L_b^{tot}$ (nm) | $L_b$ (nm) | $\epsilon_b$ (%) | $\epsilon_b^{av}$ (%) |
|---|---|---|---|---|---|---|---|
| 5-1 | 3 | 11 | −1.2 | 12 | 4 | +0.9 | +0.6 |
|  |  |  |  |  | 4 | 0.0 |  |
|  |  |  |  |  | 4 | +0.9 |  |
| 5-2 | 3 | 11 | −1.6 | 12 | 2 | +0.3 | +0.7 |
|  |  |  |  |  | 8 | +0.9 |  |
|  |  |  |  |  | 2 | +0.3 |  |
| 5-3 | 2 | 16 | −1.5 | 14 | 6 | +0.7 | +0.6 |
|  |  |  |  |  | 2 | +0.0 |  |
|  |  |  |  |  | 6 | +0.7 |  |
| 5-4 | 4 | 12 | −1.4 | 10 | 3 | +0.5 | +0.3 |
|  |  |  |  |  | 4 | 0.0 |  |
|  |  |  |  |  | 3 | +0.5 |  |
| 5-5 | 3 | 13 | −1.4 | 14 | 5 | +0.8 | +0.57 |
|  |  |  |  |  | 4 | +0.0 |  |
|  |  |  |  |  | 5 | +0.8 |  |

Table 5 shows the structures of the MQW layer 4 with regard to a plurality of laser devices of examples according to this embodiment and comparative examples. The barrier layers in the MQW layer 4 are multilayered, more specifically, three-layered.

Here, the thickness of each one of the plurality of layers forming each barrier layer is denoted as $L_b$, and the total thickness of each barrier layer formed of the plurality of layers is denoted as $L_b^{tot}$. Further, the strain amount of each of the plurality of layers forming each barrier layer is denoted as $\epsilon_b$, and the average strain amount of each barrier layer formed of the plurality of layers is denoted as $\epsilon_b^{av}$.

By the manufacturing method described in the first embodiment, a plurality of wafers were manufactured such that the MQW layer 4 had the structures shown in Table 5. It is to be noted that, with regard to all the samples, the barrier layers of the MQW layer 4 are formed of $In_{1-x-y}Ga_xAl_yAs$ such that the composition wavelength $\lambda_b$ is 1,050 nm when no strain is imposed thereon.

With regard to the plurality of wafers manufactured as described above, the luminescence wavelength was determined by photoluminescence. With regard to all the wafers, one or two oscillation peak were observed at about 1.3 μm. The two oscillation peaks are caused by the same reason described above. Further, visual inspection of upper surfaces of the wafers was made. The upper surfaces of Samples 5-1, 5-2, and 5-5 were in a mirror-smooth state. A slight crosshatch was observed on the upper surfaces of Samples 5-3 and 5-4.

With regard to the laser devices manufactured using those wafers, current-light output characteristics were measured. At 25° C., oscillation was recognized with regard to all the manufactured samples. Further, with regard to all the laser devices, TM mode oscillation was recognized.

Next, the ambient temperature was raised and current-light output characteristics were measured. As a result, a great increase in the threshold current in relation to temperature rise was observed with regard to the laser devices of Samples 5-2, 5-3, 5-4, and 5-5 compared with samples having other structures. Further, when the applied current was increased when the ambient temperature was about 50° C., a phenomenon in which light emission suddenly stopped and light emission was not recognized even after current was caused to flow therethrough once again was observed. A plurality of devices having the same structure were manufactured with regard to the respective structures and the measurement was made. Such a phenomenon was observed in 90% of the plurality of laser devices of Samples 5-3, 5-4, and 5-5 and 70% of the plurality of laser devices of Sample 5-2.

Not only the plurality of laser devices manufactured so as to have the structures shown in Table 5 but also a plurality of laser devices having structures other than those shown in Table 5 were manufactured. As a result of evaluating the characteristics of the laser devices, the following laws were discovered.

In addition to ordinary interface strain, interface strain $\epsilon_{kai}$ at the interface between a multilayered barrier layer and a well layer adjacent to the barrier layer defined as $\epsilon_w\text{-}\epsilon_b^{av}$ is introduced. Further, interface largest layer thickness $t_{kai}$ is defined as the larger one of the total thickness $L_b^{tot}$ of the barrier layer and the thickness $L_w$ of the well layer. Similarly to the case of the semiconductor electroluminescent devices according to the first embodiment, the critical interface strain is determined by Expression (2) when A=0.7. It was made clear that the interface strain $\xi_{kai}$ was desirably made to be equal to or smaller than the critical interface strain.

Further, the total thickness $t_{tot}$ and the average strain $\epsilon_{av}$ of the MQW layer 4 are defined as Expression (3) and Expression (4), with $L_b^{tot}$ and $\xi_b^{av}$ therein being substituted for $L_b$ and $\epsilon_b$, respectively. Similarly, the critical average strain is determined by Expression (5) when B=0.9. It was made clear that the average strain $\epsilon_{av}$ was more desirably made to be equal to or smaller than the critical average strain.

As described above, after the epitaxial growth, a crosshatch was recognized on the upper surfaces of Samples 5-3 and 5-4. The laser devices actually manufactured so as to have those structures were broken when the characteristics were measured. It is desirable that the structures of the MQW layer 4 are designed not to exceed the above-mentioned conditions.

Further, with regard to Samples 5-2 and 5-5 which satisfied the above-mentioned conditions but were broken when the characteristics were measured, study was made. It was discovered that, even when the structures of the MQW layer satisfy the above-mentioned conditions, if the magnitude of the interface strain $\epsilon_{kai}$ (in the case of Sample 5-2) or the magnitude of the strain $\epsilon$ (=$\epsilon_w\text{-}\epsilon_b$) at the interface between layers adjacent to each other (in the case of Sample 5-5) is larger than 2.2%, the multilayered structure was broken when the characteristics were measured. Therefore, it is desirable that the design is performed such that both the magnitude of the interface strain $\epsilon_{kai}$ and the magnitude of the strain $\epsilon$ at the interface between layers adjacent to each other are 2.2% or smaller.

In addition to the laser devices having the structures shown in Table 5, laser devices having various structures including cases in which the structure of the well layers and the structure of the barrier layers differed from one layer to another were manufactured, and similar experiments were carried out. In this case, also, when the total thickness of the i-th barrier layer is represented by $(L_b^{tot})^i$ and the average strain of the i-th barrier layer is represented by $(\epsilon_b^{av})^i$ and when those were substituted for the total thickness $t_{tot}$ of the MQW layer 4 and the average strain $\epsilon_{av}$ in Expressions (6) and (7), it was made clear that the above-mentioned conditions were appropriate.

More specifically, in the MQW layer 4, even when the composition of a barrier layer sandwiched between well layers is not uniform in the direction of crystal growth, the barrier layer as a whole has tensile strain, and it is more desirable that the interface strain between the average strain of the barrier layer as a whole and the strain imposed on a barrier layer adjacent thereto satisfies the above-mentioned conditions.

TABLE 6

| Sample no. | $N_w$ | $L_w$ (nm) | $L_b$ (nm) | $\epsilon_w$ (%) | $\epsilon_b$ (%) |
|---|---|---|---|---|---|
| 5-6 | 3 | 11 | 12 | −1.2 | +0.5 |
| 5-7 | 3 | 11 | 12 | −1.2 | +0.5 on average |

Table 6 shows the structures of the MQW layer 4 with regard to a plurality of laser devices of other examples according to this embodiment and comparative examples. Further, by the manufacturing method described in the first embodiment, a plurality of wafers are manufactured so as to have the structures shown in Table 6. Here, in each of the structures, the barrier layers of the MQW layer 4 are formed of $In_{1-x-y}Ga_xAl_yAs$ such that the composition wavelength $\lambda_b$ is 1,050 nm when no strain is imposed thereon.

Here, while strain $\epsilon_b$ of +0.5% is uniformly imposed on a barrier layer of Sample 5-6, a barrier layer of Sample 5-7 is three-layered: both sides having a thickness of 3 nm and a strain amount of 0.0%; and a center portion having a thickness of 6 nm and a strain amount of +1.0%. The average strain of the barrier layer is, therefore, +0.5%. The structures of those MQW layers 4 satisfy the above-mentioned conditions.

Visual inspection of upper surfaces of the plurality of wafers manufactured in this way was made. The upper surfaces of Samples 5-6 and 5-7 were in a mirror-smooth state. Layers other than the MQW layer had no strain, and, with respect to all the wafers, the layers other than the MQW layer 4 are formed so as to have the same structure.

Luminescence wavelengths of the plurality of wafers manufactured so as to have the structures shown in Table 6 were determined by photoluminescence. With regard to all the wafers, two oscillation peaks at about 1.3 μm were observed. The two oscillation peaks are caused by the same reason described above.

Further, ridge stripe Fabry-Perot laser devices were manufactured using those wafers by the above-mentioned method, and current-light output characteristics were measured. At 25° C., the threshold current of the laser devices of both of Samples 5-6 and 5-7 was on the order of 4 mA. Satisfactory characteristics were attained and almost no difference was observed. However, when the temperature was raised and measurement was made at about 95° C., the laser devices of Sample 5-7 oscillated with the threshold current being 8 mA, but some of the laser devices of Sample 5-6 oscillated with the threshold current being larger than 40 mA and some of the laser devices of Sample 5-6 did not oscillate, and the characteristics were nonuniform. Further, with regard to the devices of Sample 5-7, when the ambient temperature was raised to 100° C. and measurement was made, oscillation was recognized.

Comparison is made between laser devices of the two samples shown in Table 6. The main difference is caused by $\Delta\xi_v$ (=$\xi_v\text{-}\xi_{bv}$) of the valence band of the well layer. More specifically, while, with regard to Sample 5-6, $\Delta\xi_v$ is on the order of 25 meV (see FIG. 6), with regard to Sample 5-7, because the both side portions of the barrier layer have a thickness of 3 nm and a strain amount of 0.0%, $\Delta\xi_v$ is on the order of 58 meV. Therefore, it is thought that, while, with regard to Sample 5-6, the carriers overflow at a high temperature, with regard to Sample 5-7, carrier overflow is suppressed. From the above, by making longer the wavelength of the barrier layer, the average index of refraction of the MQW layer as a whole is made to be larger, light confinement is made to be larger, the threshold gain is made to be smaller, and carrier overflow which accompanies a longer wavelength is suppressed. Accordingly, improvement in temperature characteristics is achieved with the conditions on the critical layer thickness and the interface strain being satisfied.

It is to be noted that, though, in the fourth and fifth embodiments, cases in which the well layer and the barrier layer have a multilayered structure, respectively, are described, it goes without saying that effects of the present invention can be obtained even when at least part of the well layer and at least part of the barrier layer have a multilayered structure, respectively.

Sixth Embodiment

In the above description, cases in which the semiconductor electroluminescent device is a ridge stripe Fabry-Perot laser device are described. However, it goes without saying that the present invention is not limited thereto. The semiconductor electroluminescent device may be a distributed feedback laser device, a distributed Bragg reflector laser device, a distributed reflector laser device, or the like.

Figure 10A:
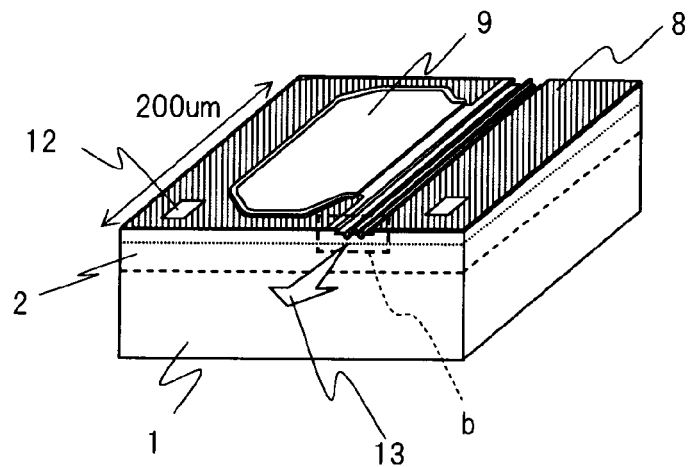
FIGS. 10A to 10C are views illustrating a structure of a distributed feedback laser device according to still another embodiment of the present invention.
Figure 10B:
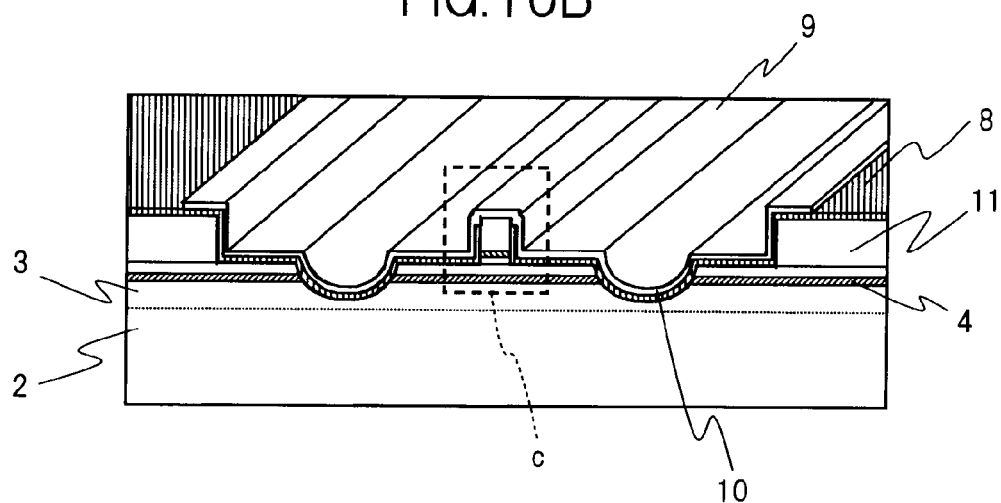
Figure 10C:
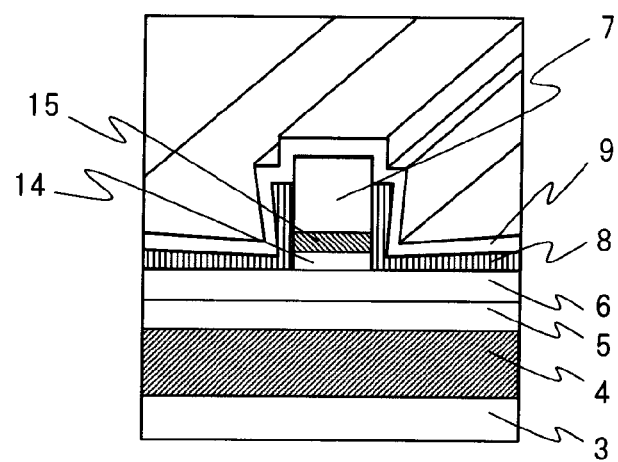

Here, a case is described in which the semiconductor electroluminescent device is a ridge stripe distributed feedback laser device with a well layer having tensile strain. FIGS. 10A to 10C illustrate a structure of a distributed feedback laser device having a distributed feedback grating. FIG. 10A is a perspective view of the whole laser device, FIG. 10B is an enlarged sectional view of a portion surrounded by the broken line b in FIG. 10A, and FIG. 10C is an enlarged sectional view of a portion surrounded by the broken line c in FIG. 10B.

First, a method of manufacturing the laser device is described in brief. An n-type InP buffer layer 2 at a thickness of 500 nm, an n-side SCH layer 3 made of InAlAs at a thickness of 50 nm, an MQW layer 4 having the structures described in the following, a p-side SCH layer 5 made of InAlAs at a thickness of 50 nm, an InGaAsP layer 6 at a thickness of 50 nm, an InP spacer 14 at a thickness of 0.2 μm, an InGaAsP grating layer 15, and a p-type InP layer 7 at a thickness of 1.5 μm are formed in the stated order on an n-type InP substrate 1. Here, the well layers and the barrier layers in the MQW layer 4 have tensile strain and compressive strain, respectively, but all of the layers other than the MQW layer 4 are formed so as to have no strain. The InGaAsP layer 6 is formed with a composition such that a composition wavelength λ is 1,200 nm.

The width of the p-type InP layer 7, that is, the ridge stripe width is 1.5 μm. In order to reduce the parasitic capacitance, an isolation groove 10 is formed adjacent to each side of the p-type InP layer 7. Further, in order to prevent extra force from concentrating on and breaking the p-type InP layer 7 in cleavage, mounting, or the like, shoulder portions 11 for reinforcement are formed as illustrated in FIG. 10B.

A passivation film 8 is formed on an upper surface of the device except for a portion over the p-type InP layer 7. Further, a p-type electrode 9 is formed as illustrated in FIG. 10A so as to be in satisfactory contact with a top portion of the p-type InP layer 7 and such that current is easily injected. Further, in order to discriminate the front from the rear, front marks 12 are formed on a front side of the upper surface of the device (FIG. 10A). Coating films (not shown) are formed on a front end surface and a rear end surface of the device such that the reflectivities thereof are 1% and 90%, respectively. It is to be noted that the length of a resonator of the device is 200 μm.

Next, some of the laser devices are described. First, in a first laser device, the $In_{1-x-y}Ga_xAl_yAs$-based MQW layer 4 is formed such that the number $N_w$ of the well layers is 6, the thickness $L_w$ of the well layer is 8 nm, the composition amount 1−x−y of In in the well layer is 0.32 (x=0.66 and y=0.02), the thickness $L_b$ of the barrier layer is 10 nm, the composition amount x of Ga in the barrier layer is 0.000, and the composition amount y of Al in the barrier layer is 0.400.

Here, in the InGaAsP grating layer 15, a λ/4 shift grating (distributed feedback grating) having a period of 201.5 nm and formed of InGaAsP and InP is formed. The thickness of InGaAsP is adjusted such that the strength κ of coupling between the emitted light and the grating is on the order of 75 $cm^{-1}$.

The structures of the MQW layer 4 satisfy the conditions described in the first and second embodiments. Visual inspection of upper surfaces of the wafers was made. With regard to all the wafers, the upper surface was in a mirror-smooth state. With regard to the plurality of wafers manufactured in this way, the luminescence wavelength was determined by photoluminescence. One oscillation peak was observed at about 1.3 μm.

The first laser device was evaluated. At 85° C., the threshold current was 17 mA and the saturation current $I_{sat}$ was 115 mA, and thus, satisfactory characteristics were attained. Further, $f_r$ current efficiency $f_r/\sqrt{I_m}$ (ratio of relaxation oscillation frequency $f_r$ with respect to square root of difference Im between drive current and threshold current) was measured. At 85° C., a value of 2.6 GHz/√mA was obtained. Further, life test was conducted when the ambient temperature was 95° C. in which current was applied such that the output was constantly 8 mW. The result was that the applied current almost did not changed for 5,000 hours and more, and it was confirmed that the present invention was effective.

Next, in a second laser device, the $In_{1-x-y}Ga_xAl_yAs$-based MQW layer 4 is formed such that the number $N_w$ of the well layers is 5, the thickness $L_w$ of the well layer is 9 nm, the composition amount 1−x−y of In in the well layer is 0.33 (x=0.64 and y=0.03), the thickness $L_b$ of the barrier layer is 10 nm, the composition amount x of Ga in the barrier layer is 0.076, and the composition amount y of Al in the barrier layer is 0.326.

Here, in the InGaAsP grating layer 15, a λ/4 shift grating having a period of 201.3 nm and formed of InGaAsP and InP is formed. The thickness of InGaAsP is adjusted such that the strength κ of coupling between the emitted light and the grating is on the order of 75 $cm^{-1}$. Further, the p-type electrode 9 is plated by gold with a thickness of 3 μm.

Similarly to the case of the first laser device, the structures of the MQW layer 4 satisfy the conditions described in the first and second embodiments. With regard to all the wafers, the upper surface was in a mirror-smooth state. With regard to the plurality of wafers manufactured in this way, the luminescence wavelength was determined by photoluminescence. One oscillation peak was observed at about 1.3 μm.

The second laser device was evaluated. At 85° C., the threshold current was 15.6 mA and the saturation current $I_{sat}$ was 127 mA, and thus, satisfactory characteristics were attained. Further, $f_r$ current efficiency was measured. At 85° C., a value of 2.5 GHz/√mA was obtained. In this way, the obtained saturation current $I_{sat}$ was more satisfactory than that in the case of the first laser device. This is because, by gold-plating the p-type electrode 9, the thermal dissipation was improved. Further, life test in which current was applied such that the output was constantly 8 mW was conducted when the ambient temperature was 95° C. The result was that the applied current almost did not changed for 5,000 hours and more, and it was confirmed that the present invention was effective.

Finally, in a third laser device, the $In_{1-x-y}Ga_xAl_yAs$-based MQW layer 4 is formed such that the number $N_w$ of the well layers is 8, the thickness $L_w$ of the well layer is 11 nm, the composition amount 1−x−y of In in the well layer is 0.39 (x=0.56 and y=0.05), the thickness $L_b$ of the barrier layer is 10 nm, the composition amount x of Ga in the barrier layer is 0.073, and the composition amount y of Al in the barrier layer is 0.315.

Here, in the InGaAsP grating layer 15, a λ/4 shift grating having a period of 201.8 nm and formed of InGaAsP and InP is formed. The thickness of InGaAsP is adjusted such that the strength κ of coupling between the emitted light and the grating is on the order of 100 cm$^{-1}$.

Similarly to the cases of the first laser device and the second laser device, the structures of the MQW layer 4 satisfy the conditions described in the first and second embodiments. With regard to all the wafers, the upper surface was in a mirror-smooth state. With regard to the plurality of wafers manufactured in this way, the luminescence wavelength was determined by photoluminescence. Two oscillation peaks were observed at about 1.3 μm and at about 1.25 μm. The two oscillation peaks are caused by the same reason described above.

The third laser device is different from the first and second laser devices in that the ridge stripe width is 1.3 μm, the reflectivities of coating films formed on a front end surface and a rear end surface of the device are 1% and 95%, respectively, the length of a resonator of the laser device is 150 μm, and the like.

The third laser device was evaluated. At 85° C., the threshold current was 19.8 mA and the saturation current $I_{sat}$ was 90 mA, and thus, satisfactory characteristics were attained. Further, $f_r$ current efficiency was measured. At 85° C., a value of 2.7 GHz/√mA was obtained. Further, life test was conducted when the ambient temperature was 95° C. in which current was applied such that the output was constantly 8 mW. The result was that the applied current almost did not changed for 5,000 hours and more, and it was confirmed that the present invention was effective.

In the above description, semiconductor electroluminescent devices according to some embodiments of the present invention are described by means of specific examples and comparative examples. However, those are selected only for describing the conditions found, and the present invention is not limited thereto. It is confirmed that MQW layers having other structures also satisfy the conditions. Further, the thickness and the strain were changed with regard to each layer in the MQW layer, and similar study was made. It was confirmed that the above-mentioned conditions were satisfied. In this way, a wafer of an InGaAlAs-based semiconductor electroluminescent device can be obtained with stability.

Seventh Embodiment

A semiconductor electroluminescent device according to a seventh embodiment of the present invention is a semiconductor electroluminescent device in the 1.3 μm band in which an MQW layer including $In_{1-x}Ga_xAs_yP_{1-y}$-based well layers and $In_{1-x-y}Ga_xAl_yAs$-based barrier layers is formed above an InP substrate. Each of the well layers in the MQW layer has tensile strain while each of the barrier layers in the MQW layer has compressive strain. A semiconductor electroluminescent device as used herein is, for example, a ridge stripe Fabry-Perot laser device. The laser device is manufactured by the manufacturing method described in the first embodiment. It is to be noted that, in the MQW layer 4 of the semiconductor electroluminescent device according to the embodiment described in the following, unless otherwise specified, the well layers having tensile strain are $In_{1-x}Ga_xAs_yP_{1-y}$-based and the barrier layers having compressive strain are $In_{1-x-y}Ga_xAl_yAs$-based.

TABLE 7

| Sample no. | $N_w$ | $L_w$ (nm) | $L_b$ (nm) | $\epsilon_w$ (%) | $\epsilon_b$ (%) |
|---|---|---|---|---|---|
| 7-1 | 5 | 12 | 8 | −1.1 | +0.5 |
| 7-2 | 2 | 16 | 14 | −1.5 | +0.5 |
| 7-3 | 4 | 12 | 11 | −1.5 | +0.6 |
| 7-4 | 5 | 12 | 8 | −1.2 | +0.5 |

Table 7 shows the structures of the MQW layer 4 with regard to a plurality of laser devices of examples according to this embodiment and comparative examples. The barrier layers of the MQW layer 4 are formed of $In_{1-x-y}Ga_xAl_yAs$ or $In_{1-y}Al_yAs$ such that the composition wavelength $\lambda_b$ is 830 nm when no strain is imposed thereon.

With regard to the plurality of wafers manufactured so as to have the structures shown in Table 7, the luminescence wavelength was determined by photoluminescence. With regard to all the wafers, one or two oscillation peaks were observed at about 1.3 μm. The two oscillation peaks are caused by the same reason described above.

Further, visual inspection of upper surfaces of those wafers was made. A slight crosshatch was observed on the upper surfaces of Samples 7-2, 7-3, and 7-4. The upper surfaces of other wafers were in a mirror-smooth state.

With regard to the laser devices manufactured using those wafers, current-light output characteristics were measured. At 25° C., oscillation was recognized with regard to all the manufactured samples. Further, with regard to all the laser devices, TM mode oscillation was recognized.

It is to be noted that, in this embodiment, the ridge stripe width is adapted to be 1.5 μm, but as a result of study on laser devices having this device structure with different widths of the ridge stripe, it was confirmed that, if the ridge stripe width was 3 μm or smaller, the laser device oscillates with the polarization direction being stable.

Next, the ambient temperature was raised and current-light output characteristics were measured. As a result, a great increase in the threshold current in relation to temperature rise was observed with regard to the laser devices of Samples 7-2, 7-3, and 7-4 compared with samples having other structures. Further, when the applied current was increased when the ambient temperature was about 50° C., a phenomenon in which light emission suddenly stopped and light emission was not recognized even after current was caused to flow therethrough once again was observed. A plurality of devices having the same structure were manufactured with regard to the respective structures and the measurement was made. Such a phenomenon was observed in 80% to 90% of the plurality of laser devices of Samples 7-2 and 7-4 and 50% of the plurality of laser devices of Sample 7-3.

Not only the plurality of laser devices manufactured so as to have the structures shown in Table 7 but also a plurality of laser devices having structures other than those shown in Table 7 were manufactured. As a result of evaluating the characteristics of those laser devices, laws similar to the laws according to the first embodiment were discovered.

More specifically, the critical interface strain is determined by Expression (2) when A=0.7. It was made clear that the interface strain $\epsilon_{kai}$ was desirably made to be equal to or smaller than the critical interface strain. Sample 7-2 does not satisfy this condition.

In addition, the critical average strain is determined by Expression (5) when B=0.9. It was made clear that the average strain $\epsilon_{av}$ was more desirably made to be equal to or smaller than the critical average strain. Sample 7-4 does not satisfy this condition.

As described above, after the epitaxial growth, a crosshatch was recognized on the upper surfaces of Samples 7-2 and 7-4. The laser devices actually manufactured so as to have the structures were broken when the characteristics were measured. It is desirable that the structures of the MQW layer 4 are designed to satisfy the above-mentioned conditions.

Further, with regard to Sample 7-3 which satisfied the above-mentioned conditions but in which a crosshatch was similarly observed and which was broken when the characteristics were measured, study was made, and it was discovered that, even when the structures of the MQW layer satisfy the above-mentioned conditions, if the magnitude of the interface strain $\epsilon_{kai}$ is larger than 2.0%, the multilayered structure was broken when the characteristics were measured. Therefore, it is more desirable that the design is performed such that the magnitude of the interface strain $\epsilon_{kai}$ is 2.0% or smaller. From this, conditions to be satisfied by a composition amount 1−x of In and a composition amount 1−y of P in the well layers can be experimentally determined as 1−x≥0.4 and 1−y≥0.09.

Figure 11:
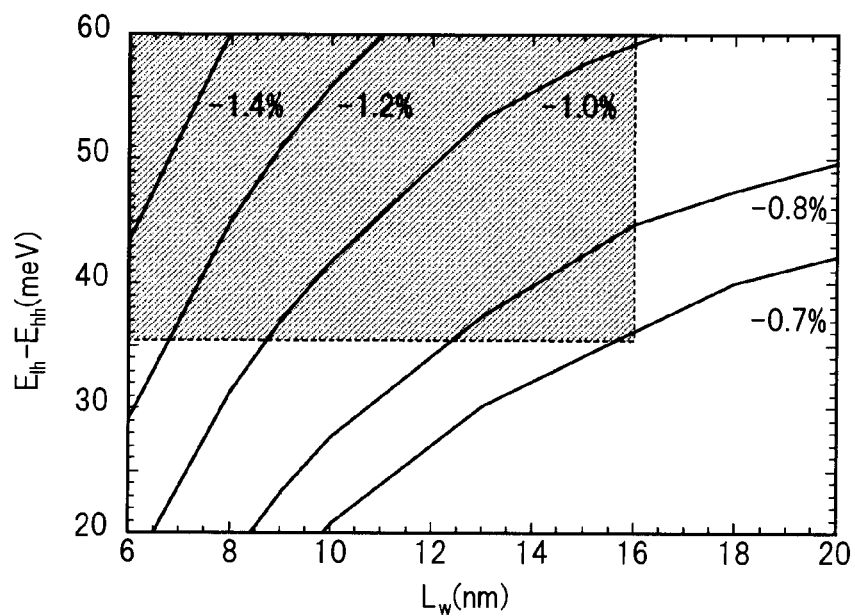
FIG. 11 is a graph of dependence of splitting energy on a thickness of a well layer and on a strain amount of a well layer in a multiple-quantum well layer of a semiconductor electroluminescent device according to still another embodiment of the present invention.

Similarly to FIG. 2, FIG. 11 illustrates the results of calculation of the dependence of the splitting energy $E_{lh}$-$E_{hh}$ on the thickness $L_w$ of the well layer and on the strain amount $\epsilon_w$ of the well layer in the laser devices. It is to be noted that, similarly to the case of FIG. 2, a plurality of curves in FIG. 11 correspond to respective values of the strain amount $\epsilon_w$ of the well layer. As described above, it is desirable that the splitting energy $E_{lh}$-$E_{hh}$ is 35 meV (130° C.) or larger, the thickness $L_w$ of the well layer is 16 nm or smaller, and the magnitude of the strain amount $\epsilon_w$ of the well layer is 0.7% or larger. This range is shown by broken lines in FIG. 11. From FIG. 11, conditions to be satisfied by the composition amount 1−x of In and the composition amount 1−y of P in the well layer are experimentally obtained as 1−x≥0.6 and 1−y≥0.35. Taking into consideration a case in which the compressive strain imposed on the barrier layer is at the minimum, it is desirable that the magnitude of the interface strain $\epsilon_{kai}$ is also at least 0.7% or larger.

Therefore, it is more desirable that the magnitude of the interface strain $\epsilon_{kai}$ at each of the interfaces is 0.7% or larger and 2.0% or smaller, and it is still more desirable that the composition amount 1−x of In in the well layer is 0.4 or larger and 0.6 or smaller and the composition amount 1−y of P in the well layer is 0.07 or larger and 0.35 or smaller.

It is to be noted that Japanese Patent Application Laid-Open No. Hei 07-249828 has a description related to strain compensation. However, the number of the well layers are not disclosed, and thus, there is no suggestion with regard to the present invention.

Eighth Embodiment

A semiconductor electroluminescent device according to an eighth embodiment of the present invention is the ridge stripe Fabry-Perot laser device according to the seventh embodiment which additionally considers the composition of the barrier layers.

TABLE 8

| Sample no. | $N_w$ | $L_w$ (nm) | $L_b$ (nm) | $\epsilon_w$ (%) | $\epsilon_b$ (%) | Composition of barrier layer | |
|---|---|---|---|---|---|---|---|
| | | | | | | x | y |
| 8-1 | 3 | 13 | 14 | −1.2 | +0.3 | 0.064 | 0.368 |
| 8-2 | 3 | 13 | 14 | −1.2 | +0.3 | 0.106 | 0.325 |

Table 8 shows the structures of the MQW layer 4 with regard to laser devices of examples according to this embodiment and comparative examples, respectively. By the manufacturing method described in the seventh embodiment, a plurality of wafers are manufactured so as to have the structures shown in Table 8, and a plurality of laser devices are manufactured using those wafers. It is to be noted that upper surfaces of the wafers were studied by visual inspection. With regard to both of Samples 8-1 and 8-2, the upper surface was in a mirror-smooth state.

With regard to the laser devices, similarly to the case of the laser devices according to the seventh embodiment, current-light output characteristics were measured. At 25° C., the threshold current of the laser devices of both of Samples 8-1 and 8-2 were on the order of 4 mA. Satisfactory characteristics were attained and almost no difference was observed. However, when the temperature was raised and measurement was made at about 95° C., while the laser devices of Sample 8-1 oscillated with the threshold current being 8 mA, some of the laser devices of Sample 8-2 oscillated with the threshold current being larger than 50 mA and some of the laser devices of Sample 8-2 did not oscillate, and the characteristics were nonuniform. Further, with regard to the devices of Sample 8-1, when the ambient temperature was raised to 100° C. and measurement was made, oscillation was recognized.

Comparison is made between laser devices of the two samples shown in Table 8. It is thought that the main difference resides in the composition of the barrier layers and, at a high temperature, while the laser devices of Sample 8-1 oscillate, the laser devices of Sample 8-2 do not oscillate satisfactorily because of the same reason as that described in the second embodiment.

Figure 12:
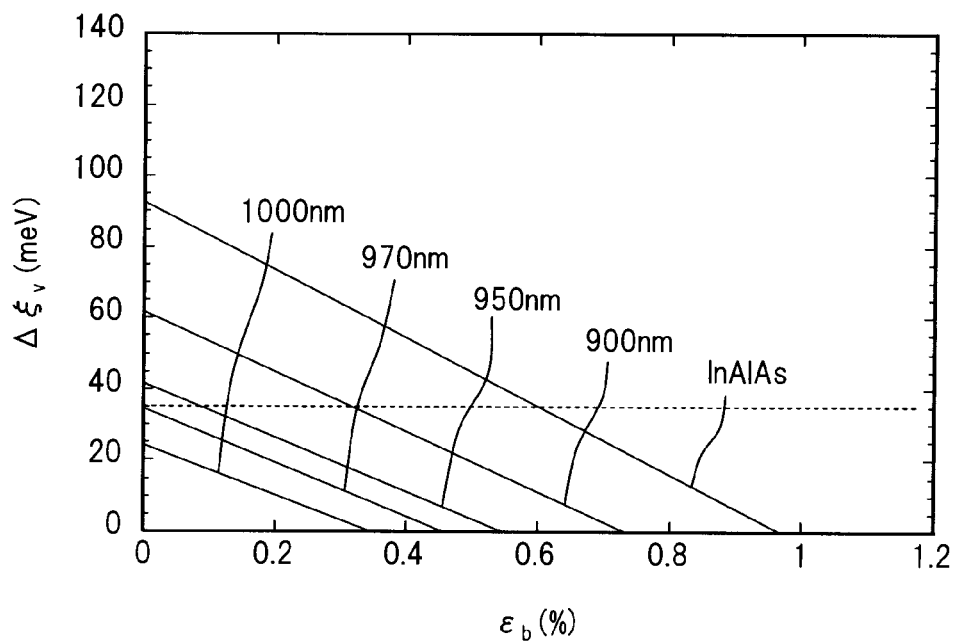
FIG. 12 is a graph of dependence of energy difference $\Delta \xi_v$ on a strain amount of a barrier layer of a semiconductor electroluminescent device according to still another embodiment of the present invention.

FIG. 12 is a graph of dependence of $\Delta\xi_v$ on the strain amount $\epsilon_b$ of the barrier layer with respect to various composition wavelengths $\lambda_b$ of the barrier layer. It is to be noted that a plurality of curves in FIG. 12 correspond to respective values of the composition wavelength $\lambda_b$ of the barrier layer. FIG. 12 shows that, the smaller the magnitude of the strain amount $\epsilon_b$ is, and the shorter the composition wavelength $\lambda_b$ of the barrier layer is, the larger $\Delta\xi_v$ becomes.

Similarly to the case illustrated in FIG. 6, in order to attain satisfactory characteristics at a temperature as high as about 100° C., similarly to the case of the splitting energy $E_{lh}$-$E_{hh}$, it is desirable that $\Delta\xi_v$ is 35 meV (130° C.) or larger.

Figure 13:
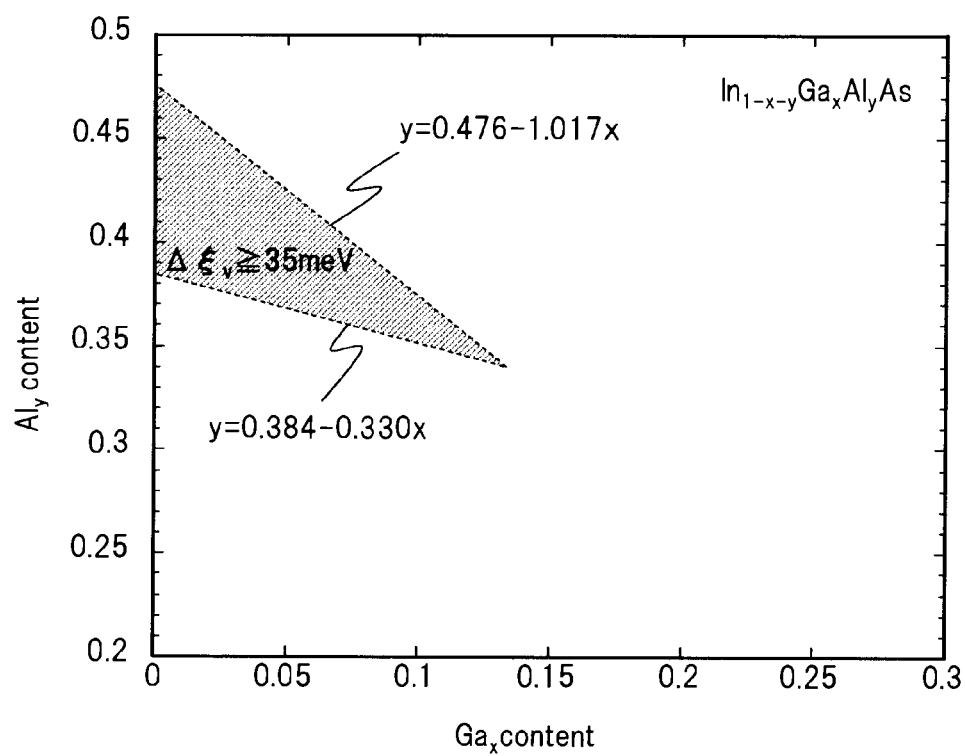
FIG. 13 is a phase graph illustrating a range of a composition amount of the barrier layer of the semiconductor electroluminescent device according to the still another embodiment of the present invention.

The range of the composition of the barrier layer when $\Delta\xi_v$ is 35 meV or larger is experimentally determined. This is attained when a composition amount x of Ga in the barrier layer is 0.0 or larger and a composition amount y of Al in the barrier layer is 0.384-0.330x or larger and 0.476-1.017x or smaller. $\Delta\xi_v$ of Sample 8-1 in which the composition amount y of Al in the barrier layer is within this range satisfies this condition. FIG. 13 is a phase diagram illustrating the range in which the composition amount x of Ga and the composition amount y of Al in the barrier layer satisfy the above-mentioned conditions.

Ninth Embodiment

A semiconductor electroluminescent device according to a ninth embodiment of the present invention is the ridge stripe Fabry-Perot laser device according to the seventh embodiment which additionally considers the number $N_w$ of the well layers in the MQW layer 4.

Similarly to the case described in the third embodiment, a condition for making the saturation current $I_{sat}$ 125 mA at 85° C. is determined from the results of an experiment of laser devices of samples manufactured so as to have structures shown in Table 9.

TABLE 9

| Sample no. | $N_w$ | $L_w$ (nm) | $L_b$ (nm) | $\epsilon_w$ (%) | $\epsilon_b$ (%) | Composition of barrier layer x | y |
|---|---|---|---|---|---|---|---|
| 9-1 | 3 | 11 | 10 | −1.0 | +0.3 | 0.064 | 0.368 |
| 9-2 | 4 | 11 | 10 | −1.0 | +0.3 | 0.064 | 0.368 |
| 9-3 | 5 | 11 | 10 | −1.0 | +0.3 | 0.064 | 0.368 |
| 9-4 | 5 | 10 | 10 | −1.0 | +0.3 | 0.064 | 0.368 |
| 9-5 | 5 | 9 | 10 | −1.1 | +0.3 | 0.064 | 0.368 |
| 9-6 | 5 | 8 | 10 | −1.2 | +0.3 | 0.064 | 0.368 |
| 9-7 | 6 | 11 | 10 | −1.0 | +0.3 | 0.064 | 0.368 |

Table 9 shows the structures of the MQW layer 4 with regard to a plurality of laser devices of examples according to this embodiment and comparative examples. All of the structures of the MQW layer 4 satisfy the conditions described in the seventh and eighth embodiments. By the manufacturing method described in the first embodiment, wafers were manufactured so as to have the structures shown in Table 9. Upper surfaces of the manufactured wafers were studied by visual inspection. With regard to all the wafers, the upper surface was in a mirror-smooth state.

Further, ridge stripe Fabry-Perot laser devices were manufactured using those wafers by the above-mentioned method, and similar measurement was made. The result was similar to that with regard to the laser devices according to the third embodiment. More specifically, in order to attain the saturation current $I_{sat}$ of 125 mA or larger at 85° C., the necessary number $N_w$ of the well layers is 5 or larger.

Tenth Embodiment

Similarly to the case of the fourth embodiment, well layers in the MQW layer 4 of a semiconductor electroluminescent device according to a tenth embodiment of the present invention are multilayered, more specifically, three-layered.

TABLE 10

| Sample no. | $N_w$ | $L_w^{tot}$ (nm) | $L_w$ (nm) | $\epsilon_w$ (%) | $\epsilon_w^{av}$ (%) | $L_b$ (nm) | $\epsilon_b$ (%) |
|---|---|---|---|---|---|---|---|
| 10-1 | 5 | 12 | 2 | −0.9 | −1.1 | 8 | +0.5 |
|  |  |  | 8 | −1.2 |  |  |  |
|  |  |  | 2 | −0.9 |  |  |  |
| 10-2 | 4 | 12 | 2 | −1.0 | −1.5 | 11 | +0.6 |
|  |  |  | 8 | −1.75 |  |  |  |
|  |  |  | 2 | −1.0 |  |  |  |
| 10-3 | 2 | 16 | 4 | −1.2 | −1.5 | 14 | +0.5 |
|  |  |  | 8 | −1.8 |  |  |  |
|  |  |  | 4 | −1.2 |  |  |  |
| 10-4 | 5 | 12 | 3 | −1.0 | −1.2 | 8 | +0.5 |
|  |  |  | 6 | −1.4 |  |  |  |
|  |  |  | 3 | −1.0 |  |  |  |
| 10-5 | 5 | 12 | 3 | −1.6 | −1.1 | 8 | +0.5 |
|  |  |  | 6 | −0.7 |  |  |  |
|  |  |  | 3 | −1.6 |  |  |  |

Table 10 shows the structures of the MQW layer 4 with regard to a plurality of laser devices of examples according to this embodiment and comparative examples. The well layers in the MQW layer 4 are multilayered, more specifically, three-layered.

The total thickness $L_w^{tot}$ and the average strain amount $\epsilon_w^{av}$ in Table 10 are as described in the fourth embodiment.

By the manufacturing method described in the first embodiment, a plurality of wafers were manufactured such that the MQW layer 4 had the structures shown in Table 10. It is to be noted that, with regard to all the samples, the barrier layers of the MQW layer 4 are formed of $In_{1-x-y}Ga_xAl_yAs$ such that the composition wavelength $\lambda_b$ is 900 nm when no strain is imposed thereon.

With regard to the plurality of wafers manufactured as described above, the luminescence wavelength was determined by photoluminescence. With regard to all the wafers, a broad oscillation peak with some shoulders was observed at about 1.3 μm. Further, visual inspection of upper surfaces of the wafers was made. The upper surfaces of Samples 10-1, 10-2, and 10-5 were in a mirror-smooth state. A slight cross-hatch was observed on the upper surfaces of Samples 10-3 and 10-4.

With regard to the laser devices manufactured using those wafers, current-light output characteristics were measured. At 25° C., oscillation was recognized with regard to all the manufactured samples. Further, with regard to all the laser devices, TM mode oscillation was recognized.

Next, the ambient temperature was raised and current-light output characteristics were measured. As a result, a great increase in the threshold current in relation to temperature rise was observed with regard to the laser devices of Samples 10-2, 10-3, 10-4, and 10-5 compared with samples having other structures. Further, when the applied current was increased when the ambient temperature was about 50° C., a phenomenon in which light emission suddenly stopped and light emission was not recognized even after current was caused to flow therethrough once again was observed. A plurality of devices having the same structure were manufactured with regard to the respective structures and the measurement was made. Such a phenomenon was observed in 90% of the plurality of laser devices of Samples 10-3, 10-4, and 10-5 and 80% of the plurality of laser devices of Sample 10-2.

Not only the plurality of laser devices manufactured so as to have the structures shown in Table 10 but also a plurality of laser devices having structures other than those shown in Table 10 were manufactured. As a result of evaluating the characteristics of the laser devices, the following laws were discovered.

In addition to ordinary interface strain, interface strain $\epsilon_{kai}$ at the interface between a multilayered well layer and a barrier layer adjacent to the well layer defined as $\epsilon_w^{av} - \epsilon_b$ is introduced. Further, interface largest layer thickness $t_{kai}$ is defined as the larger one of the total thickness $L_w^{tot}$ of the well layer and the thickness $L_b$ of the barrier layer. Similarly to the case of the semiconductor electroluminescent devices according to the first embodiment, the critical interface strain is determined by Expression (2) when A=0.7. It was made clear that the interface strain $\epsilon_{kai}$ was desirably made to be equal to or smaller than the critical interface strain.

Further, the total thickness $t_{tot}$ and the average strain $\epsilon_{av}$ of the MQW layer 4 are defined as Expression (3) and Expression (4), with $L_w^{tot}$ and $\epsilon_w^{av}$ therein being substituted for $L_w$ and $\epsilon_w$, respectively. Similarly, the critical average strain is determined by Expression (5) when B=0.9. It was made clear that the average strain $\epsilon_{av}$ was more desirably made to be equal to or smaller than the critical average strain.

As described above, after the epitaxial growth, a crosshatch was recognized on the upper surfaces of Samples 10-3 and 10-4. The laser devices actually manufactured so as to have the structures were broken when the characteristics were measured. It is desirable that the structures of the MQW layer 4 are designed not to exceed the above-mentioned conditions.

Further, with regard to Samples 10-2 and 10-5 which satisfied the above-mentioned conditions but were broken when the characteristics were measured, study was made. It was discovered that, even when the structures of the MQW layer satisfy the above-mentioned conditions, if the magnitude of the interface strain $\epsilon_{kai}$ (in the case of Sample 10-2) or the magnitude of the strain ($=\epsilon_w-\epsilon_b$) at the interface between layers adjacent to each other (in the case of Sample 10-5) is larger than 2.0%, the multilayered structure was broken when the characteristics were measured. Therefore, it is desirable that the design is performed such that both the magnitude of the interface strain $\epsilon_{kai}$ and the magnitude of the strain c at the interface between layers adjacent to each other are 2.0% or smaller.

In addition to the laser devices having the structures shown in Table 10, with regard to laser devices having various structures including cases in which the structure of the well layers and the structure of the barrier layers differed from one layer to another, similar results with the semiconductor electroluminescent device according to the fourth embodiment were obtained.

Eleventh Embodiment

Similar to the case of the fifth embodiment, barrier layers in the MQW layer 4 of a semiconductor electroluminescent device according to a eleventh embodiment of the present invention are multilayered, more specifically, three-layered.

TABLE 11

| Sample no. | $N_w$ | $L_w$ (nm) | $\epsilon_w$ (%) | $L_b^{tot}$ (nm) | $L_b$ (nm) | $\epsilon_b$ (%) | $\epsilon_b^{av}$ (%) |
|---|---|---|---|---|---|---|---|
| 11-1 | 3 | 11 | −1.2 | 12 | 5 | +0.6 | +0.5 |
|  |  |  |  |  | 2 | 0.0 |  |
|  |  |  |  |  | 5 | +0.6 |  |
| 11-2 | 3 | 11 | −1.5 | 12 | 2 | +0.3 | +0.6 |
|  |  |  |  |  | 8 | +0.6 |  |
|  |  |  |  |  | 2 | +0.3 |  |
| 11-3 | 2 | 16 | −1.5 | 12 | 3 | +0.4 | +0.5 |
|  |  |  |  |  | 6 | +0.6 |  |
|  |  |  |  |  | 3 | +0.4 |  |
| 11-4 | 4 | 12 | −1.4 | 10 | 3 | +0.1 | +0.3 |
|  |  |  |  |  | 4 | +0.6 |  |
|  |  |  |  |  | 3 | +0.1 |  |
| 11-5 | 3 | 13 | −1.4 | 12 | 3 | +0.7 | +0.5 |
|  |  |  |  |  | 6 | +0.3 |  |
|  |  |  |  |  | 3 | +0.7 |  |

Table 11 shows the structures of the MQW layer 4 with regard to a plurality of laser devices of examples according to this embodiment and comparative examples. The barrier layers in the MQW layer 4 are multilayered, more specifically, three-layered.

The total thickness $L_b^{tot}$ and the average strain amount $\epsilon_b^{av}$ in Table 11 are as described in the fifth embodiment.

By the manufacturing method described in the eleventh embodiment, a plurality of wafers were manufactured such that the MQW layer 4 had the structures shown in Table 11. It is to be noted that, with regard to all the samples, the barrier layers of the MQW layer 4 are formed of $In_{1-x-y}Ga_xAl_yAs$ such that the composition wavelength $\lambda_b$ is 1,050 nm when no strain is imposed thereon.

With regard to the plurality of wafers manufactured as described above, the luminescence wavelength was determined by photoluminescence. With regard to all the wafers, one or two oscillation peaks were observed at about 1.3 μm. The two oscillation peaks are caused by the same reason described above. Further, visual inspection of upper surfaces of the wafers was made. The upper surfaces of Samples 11-1 and 11-2 were in a mirror-smooth state. A slight crosshatch was observed on the upper surfaces of Samples 11-3, 11-4, and 11-5.

With regard to the laser devices manufactured using those wafers, current-light output characteristics were measured. At 25° C., oscillation was recognized with regard to all the manufactured samples. Further, with regard to all the laser devices, TM mode oscillation was recognized.

Next, the ambient temperature was raised and current-light output characteristics were measured. As a result, a great increase in the threshold current in relation to temperature rise was observed with regard to the laser devices of Samples 11-2, 11-3, 11-4, and 11-5 compared with samples having other structures. Further, when the applied current was increased when the ambient temperature was about 50° C., a phenomenon in which light emission suddenly stopped and light emission was not recognized even after current was caused to flow therethrough once again was observed. A plurality of devices having the same structure were manufactured with regard to the respective structures and the measurement was made. Such a phenomenon was observed in 90% of the plurality of laser devices of Samples 11-3, 11-4, and 11-5 and 80% of the plurality of laser devices of Sample 11-2.

Not only the plurality of laser devices manufactured so as to have the structures shown in Table 11 but also a plurality of laser devices having structures other than those shown in Table 11 were manufactured. As a result of evaluating the characteristics of the laser devices, the following laws were discovered.

In addition to ordinary interface strain, interface strain $\epsilon_{kai}$ at the interface between a multilayered barrier layer and a well layer adjacent to the barrier layer defined as $\epsilon_{kai}=\epsilon_w-\epsilon_b^{av}$ is introduced. Further, interface largest layer thickness $t_{kai}$ is defined as the larger one of the total thickness $L_b^{tot}$ of the barrier layer and the thickness $L_w$ of the well layer. Similarly to the case of the semiconductor electroluminescent devices according to the first embodiment, the critical interface strain is determined by Expression (2) when A=0.7. It was made clear that the interface strain $\epsilon_{kai}$ was desirably made to be equal to or smaller than the critical interface strain.

Further, the total thickness $t_{tot}$ and the average strain $\epsilon_{av}$ of the MQW layer 4 are defined as Expression (3) and Expression (4), with $L_b$ and $\epsilon_b$ therein being substituted for $L_b^{tot}$ and $\epsilon_b^{av}$, respectively. Similarly, the critical average strain is determined by Expression (5) when B=0.9. It was made clear that the average strain $L_{av}$ was more desirably made to be equal to or smaller than the critical average strain.

As described above, after the epitaxial growth, a crosshatch was recognized on the upper surfaces of Samples 11-3 and 11-4. The laser devices actually manufactured so as to have those structures were broken when the characteristics were measured. It is desirable that the structures of the MQW layer 4 be designed so as not to exceed the above-mentioned conditions.

Further, with regard to Samples 11-2 and 11-5 which satisfied the above-mentioned conditions but were broken when the characteristics were measured, study was made. It was discovered that, even when the structures of the MQW layer satisfy the above-mentioned conditions, if the magnitude of the interface strain $\epsilon_{kai}$ (in the case of Sample 10-2) or the magnitude of the strain $\epsilon(=\epsilon_w-\epsilon_b)$ at the interface between layers adjacent to each other (in the case of Sample 10-5) is larger than 2.0%, the multilayered structure was broken when the characteristics were measured. Therefore, it is desirable that the design be performed such that both the magnitude of the interface strain $\epsilon_{kai}$ and the magnitude of the strain $\epsilon$ at the interface between layers adjacent to each other are 2.0% or smaller.

In addition to the laser devices having the structures shown in Table 11, with regard to laser devices having various structures including cases in which the structure of the well layers and the structure of the barrier layers differed from one layer to another, results similar to those of the semiconductor electroluminescent device of the fifth embodiment were obtained.

TABLE 12

| Sample no. | $N_w$ | $L_w$ (nm) | $L_b$ (nm) | $\epsilon_w$ (%) | $\epsilon_b$ (%) |
|---|---|---|---|---|---|
| 11-6 | 3 | 11 | 12 | −1.2 | +0.5 |
| 11-7 | 3 | 11 | 12 | −1.2 | +0.5 on average |

Table 12 shows the structures of the MQW layer 4 with regard to a plurality of laser devices of other examples according to this embodiment and comparative examples. Further, by the manufacturing method described in the first embodiment, a plurality of wafers are manufactured so as to have the structures shown in Table 12. Here, in each of the structures, the barrier layers of the MQW layer 4 are formed of $In_{1-x-y}Ga_xAl_yAs$ such that the composition wavelength $\lambda_b$ is 900 nm when no strain is imposed thereon.

Here, while strain $\epsilon_b$ of +0.5% is uniformly imposed on a barrier layer of Sample 11-6, a barrier layer of Sample 11-7 is three-layered: both sides having a thickness of 3 nm and a strain amount of 0.0%; and a center portion having a thickness of 6 nm and a strain amount of +1.0%. The average strain of the barrier layer is, therefore, +0.5%. The structures of those MQW layers 4 satisfy the above-mentioned conditions.

Visual inspection of upper surfaces of the plurality of wafers manufactured in this way was made. The upper surfaces of Samples 11-6 and 11-7 were in a mirror-smooth state. Layers other than the MQW layer had no strain and the same multilayer and, with respect to all the wafers, the layers other than the MQW layer 4 are formed so as to have the same multilayer structure.

Luminescence wavelengths of the plurality of wafers manufactured so as to have the structures shown in Table 12 were determined by photoluminescence. With regard to all the wafers, two oscillation peaks at about 1.3 μm were observed. The two oscillation peaks are caused by the same reason described above.

Further, ridge stripe Fabry-Perot laser devices were manufactured using those wafers by the above-mentioned method, and current-light output characteristics were measured. At 25° C., the threshold currents of the laser devices of both of Samples 11-6 and 11-7 were on the order of 5 mA. Satisfactory characteristics were attained and almost no difference was observed. However, when the temperature was raised and measurement was made at about 95° C., the laser devices of Samples 11-7 oscillated with the threshold current being 10 mA, but some of the laser devices of Sample 11-6 oscillated with the threshold current being larger than 50 mA and some of the laser devices of Sample 11-6 did not oscillate, and the characteristics were nonuniform. Further, with regard to the devices of Sample 11-7, when the ambient temperature was raised to 100° C. and measurement was made, oscillation was recognized.

Comparison is made between laser devices of the two samples shown in Table 12. The main difference is caused by $\Delta\xi_v$ ($=\xi_v-\xi_{bv}$) of the valence band of the well layer. More specifically, while, with regard to Sample 11-6, $\Delta\xi_v$ is on the order of 20 meV (see FIG. 12), with regard to Sample 11-7, because the both end portions of the barrier layer have a thickness of 3 nm and a strain amount of 0.0%, $\Delta\xi_v$ is on the order of 63 meV. Therefore, it is thought that, while, with regard to Sample 11-6, the carriers overflow at high temperature, with regard to Sample 11-7, carrier overflow is suppressed. From the above, by making longer the wavelength of the barrier layer, the average index of refraction of the MQW layer as a whole is made to be larger, light confinement is made to be larger, the threshold gain is made to be smaller, and carrier overflow which accompanies a longer wavelength is suppressed. Accordingly, improvement in temperature characteristics is achieved with the conditions on the critical layer thickness and the interface strain being satisfied.

It is to be noted that, though, in the tenth and eleventh embodiments, cases in which the well layer and the barrier layer have a multilayered structure, respectively, are described, it goes without saying that the effects of the present invention can be obtained even when at least part of the well layer and at least part of the barrier layer have a multilayered structure, respectively.

Twelfth Embodiment

It goes without saying that, similarly to the sixth embodiment, the semiconductor electroluminescent device is not limited to a ridge stripe Fabry-Perot laser device. The semiconductor electroluminescent device may be a distributed feedback laser device, a distributed Bragg reflector laser device, a distributed reflector laser device, or the like.

Laser devices manufactured by the manufacturing method described in the sixth embodiment are described. The laser devices are different from the semiconductor electroluminescent devices according to the sixth embodiment in that, in the MQW layer 4, the well layers are $In_{1-x}Ga_xAs_yP_{1-y}$-based and the barrier layers are $In_{1-x-y}Ga_xAl_yAs$-based. The MQW layer 4 is formed such that the number $N_w$ of the well layers is 5, the thickness $L_w$ of the well layer is 11 nm, the composition amount x of Ga in the well layer is 0.45, the composition amount y of As in the well layer is 0.75, the thickness $L_b$ of the barrier layer is 10 nm, the composition amount x of Ga in the barrier layer is 0.064, and the composition amount y of Al in the barrier layer is 0.368.

Here, in the InGaAsP grating layer 15, a λ/4 shift grating having a period of 200.7 nm and formed of InGaAsP and InP is formed. The thickness of InGaAsP is adjusted such that the strength κ of coupling between the emitted light and the grating is on the order of 75 cm$^{-1}$.

The structures of the MQW layer 4 satisfy the conditions described in the seventh and eighth embodiments. Visual inspection of upper surfaces of the wafers was made, and, with regard to all the wafers, the upper surface was in a mirror-smooth state. With regard to the plurality of wafers manufactured in this way, the luminescence wavelength was determined by photoluminescence. Two oscillation peaks were observed at about 1.3 μm.

The above-mentioned laser device was evaluated. At 85° C., the threshold current was 19 mA and the saturation current $I_{sat}$ was 115 mA, and thus, satisfactory characteristics were attained. Further, $f_r$ current efficiency was measured. At 85° C., a value of 2.3 GHz/√mA was obtained. Further, life test in which current was applied such that the output was constantly 8 mW was conducted when the ambient temperature was 95° C. The result was that the applied current almost did not changed for 5,000 hours and more, and it was confirmed that the present invention was effective.

Hereinabove, semiconductor electroluminescent devices according to some embodiments of the present invention are described by means of specific examples and comparative examples. However, those are selected only for describing the found conditions, and the present invention is not limited thereto. It was also confirmed that MQW layers having other structures satisfy the conditions. Further, the thickness and the strain were changed with regard to each layer in the MQW layer, and similar study was made. It was confirmed that the above-mentioned conditions are satisfied. In this way, a wafer of an InGaAsP-based semiconductor electroluminescent device can be obtained with stability.

It is to be noted that the present invention focuses on the interface strain between a well layer and a barrier layer included in an MQW layer of a semiconductor electroluminescent device. Generally, an MQW structure has well layers and barrier layers alternately laminated therein. In the plurality of well layers, the thickness and the composition of the respective well layers are the same in some cases, and are not the same in other cases. Further, even in one well layer, the composition is uniform in the direction of crystal growth in some cases, and is nonuniform in other cases. However, as herein exemplarily described, even when the composition changes in the direction of crystal growth in one well layer, if the average strain on the layer as a whole is tensile strain, the present invention is applicable. Further, even when the way of the lamination is irregular in the MQW layer as a whole, if a portion in which well layers and barrier layers are alternately laminated is included therein, the present invention is applicable. The same can be said with regard to the barrier layers. Even if the composition changes in one barrier layer, if the average strain on the layer as a whole is compressive strain, the present invention is applicable.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor electroluminescent device comprising:
a substrate; and
a multiple-quantum well layer formed above the substrate, the multiple-quantum well layer including $In_{1-x-y}Ga_xAl_y$As-based well layers and $In_{1-x-y}Ga_xAl_y$As-based barrier layers which are alternately disposed,
the well layers each having tensile strain,
the barrier layers each having compressive strain,
wherein (1−x−y) is 0.21-0.44, and
wherein the semiconductor electroluminescent device is configured to output light having a wavelength in a 1.3 μm band;
wherein a magnitude of an interface strain at an interface between each of the well layers and each of the barrier layers is smaller than a magnitude of a critical interface strain as determined by a layer thickness value, which is the larger of a thickness of the well layer and a thickness of the barrier layer adjacent to each other with the interface therebetween, and
wherein the magnitude of the critical interface strain is determined based on a largest strain amount, the largest strain amount being determined by Matthews' formula.

2. The semiconductor electroluminescent device according to claim 1, wherein the magnitude of the critical interface strain is 0.7 times the largest strain amount, the largest strain amount being determined by Matthews' formula.

3. The semiconductor electroluminescent device according to claim 2, wherein the magnitude of the interface strain is 0.7%-2.2%.

4. The semiconductor electroluminescent device according to claim 1, wherein a magnitude of average strain of the multiple-quantum well layer is smaller than a magnitude of critical average strain, the magnitude of the critical average strain being determined by a layer thickness value of the entire multiple-quantum well layer.

5. The semiconductor electroluminescent device according to claim 4, wherein the magnitude of the critical average strain is determined based on a largest strain amount, the largest strain amount being determined by Matthews' formula.

6. The semiconductor electroluminescent device according to claim 1, wherein x is greater than or equal to 0, y is between (0.43-0.35x) and (0.476-1.017x), inclusive.

7. The semiconductor electroluminescent device according to claim 6, wherein a number of the well layers is 5 or larger.

8. A semiconductor electroluminescent device comprising:
a substrate; and
a multiple-quantum well layer formed above the substrate, the multiple-quantum well layer including $In_{1-x}Ga_xAs_yP_{1-y}$-based well layers and $In_{1-x}Ga_xAs_y$-based barrier layers which are alternately disposed,
the well layers each having tensile strain,
the barrier layers each having compressive strain,
wherein (1−x) is 0.4-0.6 and (1−y) is 0.09-0.35, and
wherein the semiconductor electroluminescent device is configured to output light having a wavelength in a 1.3 μm band;
wherein a magnitude of an interface strain at an interface between each of the well layers and each of the barrier layers is smaller than a magnitude of a critical interface strain as determined by a layer thickness value, which is the larger of a thickness of the well layer and a thickness of the barrier layer adjacent to each other with the interface therebetween, and
wherein the magnitude of the critical interface strain is determined based on a largest strain amount, the largest strain amount being determined by Matthews' formula.

9. The semiconductor electroluminescent device according to claim 8, wherein the magnitude of the critical interface strain is 0.7 times the largest strain amount, the largest strain amount being determined by Matthews' formula.

10. The semiconductor electroluminescent device according to claim 9, wherein the magnitude of the interface strain is 0.7%-2.2%.

11. The semiconductor electroluminescent device according to claim 8, wherein a magnitude of average strain of the multiple-quantum well layer is smaller than a magnitude of critical average strain, the magnitude of the critical average strain being determined by a layer thickness value of the entire multiple-quantum well layer.

12. The semiconductor electroluminescent device according to claim 11, wherein the magnitude of the critical average strain is determined based on a largest strain amount, the largest strain amount being determined by Matthews' formula.

13. The semiconductor electroluminescent device according to claim 8, wherein x is greater than or equal to 0, and y is between (0.384-0.33x) and (0.476-1.017x), inclusive.

14. The semiconductor electroluminescent device according to claim 13, wherein a number of the well layers is 5 or larger.

15. The semiconductor electroluminescent device according to claim 1, which has a ridge stripe structure.

16. The semiconductor electroluminescent device according to claim 15, which has a ridge stripe width of 3 μm or smaller.

17. The semiconductor electroluminescent device according to claim 15, further comprising a Fabry-Perot laser unit.

18. The semiconductor electroluminescent device according to claim 15, further comprising a distributed feedback grating.

19. A semiconductor electroluminescent device comprising: a substrate;
a multiple-quantum well layer formed above the substrate, the multiple-quantum well layer including $In_{1-x-y}Ga_xAl_y$As-based well layers and $In_{1-x-y}Ga_xAl_y$As-based barrier layers which are alternately disposed;
a p-type InP layer formed over the multiple-quantum well; and
a p-type electrode formed over the p-type InP layer;
wherein the well layers each having tensile strain, and the barrier layers each having compressive strain,
wherein the semiconductor electroluminescent device is configured to output light having a wavelength in a 1.3 μm band,
wherein a operation current injects from the p-type electrode, and
wherein a magnitude of interface strain at an interface between each of the well layers and each of the barrier layers is smaller than a magnitude of a critical interface strain as determined by a layer thickness value, which is the larger of a thickness of the well layer and a thickness of the barrier layers adjacent to each other with the interface therebetween.

* * * * *